(12) United States Patent
Fujita

(10) Patent No.: US 8,729,596 B2
(45) Date of Patent: May 20, 2014

(54) ORGANIC ELECTROLUMINESCENT ELEMENT, ORGANIC ELECTROLUMINESCENT DISPLAY DEVICE, ORGANIC ELECTROLUMINESCENT ILLUMINATING DEVICE, AND METHOD FOR MANUFACTURING ORGANIC ELECTROLUMINESCENT ELEMENT

(75) Inventor: Yoshimasa Fujita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 19 days.

(21) Appl. No.: 13/389,244

(22) PCT Filed: Apr. 22, 2010

(86) PCT No.: PCT/JP2010/002902
§ 371 (c)(1),
(2), (4) Date: Feb. 6, 2012

(87) PCT Pub. No.: WO2011/024348
PCT Pub. Date: Mar. 3, 2011

(65) Prior Publication Data
US 2012/0132900 A1 May 31, 2012

(30) Foreign Application Priority Data
Aug. 24, 2009 (JP) ................................. 2009-193380

(51) Int. Cl.
*H01L 33/00* (2010.01)
(52) U.S. Cl.
USPC ................ 257/101; 257/103; 257/13; 257/79
(58) Field of Classification Search
USPC ................................................... 257/79–103
See application file for complete search history.

(56) References Cited

U.S. PATENT DOCUMENTS

| 6,023,073 | A | 2/2000 | Strite | |
|---|---|---|---|---|
| 2002/0081372 | A1* | 6/2002 | Peng | ............................... 427/64 |
| 2002/0105005 | A1* | 8/2002 | Seo et al. | ...................... 257/101 |
| 2006/0131562 | A1 | 6/2006 | Li | |

(Continued)

FOREIGN PATENT DOCUMENTS

| JP | 11-504754 A | 4/1999 |
|---|---|---|
| JP | 2005-85529 A | 3/2005 |

(Continued)

OTHER PUBLICATIONS

International Search Report received for PCT Patent Application No. PCT/JP2010/002902, mailed on Jun. 29, 2010, 5 pages (2 pages of English Translation and 3 pages of PCT Search Report).

(Continued)

*Primary Examiner* — Steven Loke
*Assistant Examiner* — Cuong B Nguyen
(74) *Attorney, Agent, or Firm* — Morrison & Foerster LLP

(57) ABSTRACT

An organic electroluminescent element comprising: an anode (3); a cathode (4); and an organic layer (5), sandwiched between the anode (3) and the cathode (4), which contains a positive and negative charge transporting material, the organic layer (5) including an acceptor region (6) doped with an acceptor, a donor region (8) doped with a donor, and a light-emitting region (7) doped with an organic light-emitting material, the acceptor region (6) being located on the anode (3), the donor region (8) being located on the cathode (4), the light-emitting region (7) being located between the acceptor region (6) and the donor region (8), the acceptor having such a concentration gradient in the acceptor region (6) as to become lower in concentration from the anode (3) toward the light-emitting region (7), the donor having such a concentration gradient in the donor region (8) as to become lower in concentration from the cathode (4) toward the light-emitting region (7). This makes it possible to provide a simple-structured, high-luminance, high-efficiency, and long-life organic EL element.

12 Claims, 3 Drawing Sheets

(56) References Cited

U.S. PATENT DOCUMENTS

| | | |
|---|---|---|
| 2007/0035235 A1* | 2/2007 | Liu et al. ............ 313/504 |
| 2007/0181876 A1 | 8/2007 | Itai |
| 2008/0038583 A1 | 2/2008 | Itai et al. |
| 2008/0118724 A1 | 5/2008 | Cina et al. |
| 2009/0273280 A1* | 11/2009 | Seo et al. ............ 313/504 |
| 2010/0096622 A1 | 4/2010 | Iizumi et al. |
| 2010/0289008 A1* | 11/2010 | Jang et al. ............ 257/40 |

FOREIGN PATENT DOCUMENTS

| | | |
|---|---|---|
| JP | 2006-173619 A | 6/2006 |
| JP | 2007-208217 A | 8/2007 |
| JP | 2008-522395 A | 6/2008 |
| WO | 2005/064994 A1 | 7/2005 |
| WO | 2008/102644 A1 | 8/2008 |

OTHER PUBLICATIONS

Tsuji et al., "Bis(carbazolyl)benzodifuran: A High-Mobility Ambipolar Material for Homojunction Organic Light-Emitting Diode Devices", Advanced Materials, vol. 21, 2009, pp. 1-4.

* cited by examiner

ORGANIC ELECTROLUMINESCENT ELEMENT, ORGANIC ELECTROLUMINESCENT DISPLAY DEVICE, ORGANIC ELECTROLUMINESCENT ILLUMINATING DEVICE, AND METHOD FOR MANUFACTURING ORGANIC ELECTROLUMINESCENT ELEMENT

CROSS REFERENCE TO RELATED APPLICATIONS

This is a U.S. National Phase patent application of PCT/JP2010/002902, filed Apr. 22, 2010, which claims priority to Japanese Patent Application No. 2009-193380, filed Aug. 24, 2009, each of which is hereby incorporated by reference in the present disclosure in its entirety.

TECHNICAL FIELD

The present invention relates to an organic electroluminescent element that achieves high luminance, high efficiency, and long life with a simple structure, an organic electroluminescent display device including such an organic electroluminescent element, an organic electroluminescent illuminating device including such an organic electroluminescent element, and a method for manufacturing such an organic electroluminescent element.

BACKGROUND ART

Along with the recent development of advanced information society, there has been a growing need for flat-panel displays. Known examples of flat-panel displays include non-self-light-emitting liquid crystal displays (LCDs), self-light-emitting plasma displays (PDP), inorganic electroluminescent (inorganic EL) displays, and organic electroluminescent (hereinafter referred to as "organic EL" or "organic LED") displays, etc. Among these flat-panel displays, organic electroluminescent displays have made notable progress.

Improvements in materials and multilayering of device structures have so far been made for improving the luminous efficiency and life of organic EL displays. In particular, a multilayer structure shown in FIG. 5 is presently available for the realization of high-efficiency and long-life organic EL elements with use of phosphorescent materials. This multilayer structure includes an anode 32, a cathode 39, and six layers sandwiched between the anode 32 and the cathode 39. The six layers are a hole injection layer 33, a hole transport layer 34, a light-emitting layer 35, a hole blocking layer 36, an electron transport layer 37, and an electron injection layer 38. FIG. 5 is a schematic view showing a configuration of a conventional organic electroluminescent element.

Meanwhile, Non-patent Literature 1 discloses an organic EL element having a simple structure called "homo junction" made with a bipolar material that exhibits high charge mobility. FIG. 6 is a schematic view showing a configuration of a conventional organic electroluminescent element.

As shown in FIG. 6, an organic EL element 40 of Non-patent Literature 1 has such a simple structure that a positive and negative charge transporting light-emitting layer 47 containing a positive and negative charge transporting material is sandwiched between an anode 42 provided on a substrate 41 and a cathode 43. The positive and negative charge transporting light-emitting layer 47 includes an acceptor-doped region 44 doped with an acceptor, a light-emitting-material-doped region 45 doped with a light-emitting material, and a donor-doped region 46 doped with a donor. Non-patent Literature 1 discloses emitting EL light with both fluorescence and phosphorescence and emitting three primary colors of EL light, namely blue, green, and red EL light, in such a simple-structured organic EL element.

CITATION LIST

Non-patent Literature 1
Advanced Materials 2009, 21, 1-4

SUMMARY OF INVENTION

Technical Problem

However, multilayering of the structure of an organic EL element gives rise to problems such as a complication of steps of a manufacturing process and an increase in cost of a manufacturing apparatus.

Further, the organic EL element 40, which has a simple layer structure, undesirably decreases in luminous efficiency or luminance as time passes. This is because, in the positive and negative charge transporting light-emitting layer 47, the region 45 doped with the organic light-emitting material is in contact with the regions 44 and 46 highly doped with the acceptor and the donor, respectively.

That is, the acceptor has a lower level of HOMO (highest occupied molecular orbital) than the positive and negative charge transporting material. Since there is a great difference in level of HOMO between the region 44 highly doped with the acceptor and the region 45 doped with the organic light-emitting material, such contact between the regions 44 and 45 as that shown in Non-patent Literature 1 prevents holes injected into the acceptor-doped region 44 from the anode from efficiently propagating through the acceptor-doped region 44 to the positive and negative charge transporting material of the light-emitting-material-doped region 45. Meanwhile, the donor has a higher level of LUMO (lowest unoccupied molecular orbital) than the positive and negative charge transporting material. Since there is a great difference in level of HOMO between the region 44 highly doped with the acceptor and the region 45 doped with the organic light-emitting material, contact between the regions 44 and 45 prevents electrons injected into the donor-doped region 46 from the cathode from efficiently propagating through the donor-doped region 46 to the positive and negative charge transporting material of the light-emitting-material-doped region 45. This prevents efficient recombination of the holes and the electrons in the light-emitting-material-doped region 45. Therefore, the organic EL element 40 is inferior in luminance, luminous efficiency, and longevity to an organic EL element having a multilayer structure.

The present invention has been made in view of the foregoing problems, and it is an object of the present invention to provide a simple-structured, high-luminance, high-efficiency, and long-life organic electroluminescent element.

Solution to Problem

In order to solve the foregoing problems, an organic electroluminescent element according to the present invention includes: an anode; a cathode; and an organic layer, sandwiched between the anode and the cathode, which contains a positive and negative charge transporting material, the organic layer including a first region doped with an acceptor, a second region doped with a donor, and a third region doped with an organic light-emitting material, the first region being located on the anode, the second region being located on the cathode, the third region being located between the first region and the second region, the acceptor having such a concentration gradient in the first region as to become lower in concentration from the anode toward the third region, the donor having such a concentration gradient in the second region as to become lower in concentration from the cathode toward the third region.

In the organic electroluminescent element (also hereinafter referred to as "organic EL element") thus configured according to the present invention, the organic layer provided between the anode and the cathode contains the positive and negative charge transporting material, has the first region located on the anode and doped with the acceptor, and has the second region located on the cathode and doped with the donor. Further, the concentration gradient in the first region is such that the concentration of the acceptor with respect to the positive and negative charge transporting material becomes lower from the anode, and the concentration gradient in the second region is such that the concentration of the donor with respect to the positive and negative charge transporting material becomes lower from the cathode.

That is, in the first region, the acceptor is highest in concentration on a side of the first region that is in contact with the anode and becomes lower in concentration toward the center of the organic layer doped with the organic light-emitting material. This allows holes having been propagating through the acceptor to efficiently propagate to the positive and negative charge transporting material and, ultimately, allows the holes to completely propagate through the positive and negative charge transporting material in the third region doped with the organic light-emitting material.

Meanwhile, in the second region, the donor is highest in concentration on a side of the second region that is in contact with the cathode and becomes lower in concentration toward the center of the organic layer doped with the organic light-emitting material. This allows electrons having been propagating through the donor to efficiently propagate to the positive and negative charge transporting material and, ultimately, allows the electrons to completely propagate through the positive and negative charge transporting material in the third region doped with the organic light-emitting material.

Therefore, according to the organic EL element according to the present invention, the holes and the electrons can be smoothly transported to the third region doped with the organic light-emitting material and efficiently recombined with each other in that region. This makes it possible to keep high-luminance and high-efficiency emission over a long period of time.

In order to solve the foregoing problems, an organic electroluminescent display device according to the present invention include display means including a thin-transistor substrate and an organic electroluminescent element according to the present invention, the organic electroluminescent element being provided on the thin-transistor substrate. Further, an organic electroluminescent illuminating device includes an organic electroluminescent element according to the present invention.

Since the foregoing configuration includes an organic electroluminescent element in which holes and electrons can be efficiently injected and transported into a region doped with an organic light-emitting material, the foregoing configuration can provide a high-luminance, high-efficiency, and long-life illuminating device.

A method for manufacturing an organic electroluminescent element according to the present invention includes the step of, while moving a substrate along a parallel arrangement of evaporation sources filled with an acceptor, an organic light-emitting material, a donor, and a positive and negative charge transporting material, respectively, depositing the acceptor, the organic light-emitting material, the donor, and the positive and negative charge transporting material from the evaporation sources onto the substrate.

According to the foregoing configuration, when the substrate is moved along the prearrangement of respective evaporation sources (also referred to as "supply means) of the acceptor, the organic light-emitting material, and the donor, the materials are supplied from the respective supply means. In a case where this supply method is achieved by using an evaporation method, the materials can be deposited onto the substrate simply by carrying out an operation of moving the substrate along the supply means. This makes it possible to efficiently manufacture an organic electroluminescent element according to the present invention.

Advantageous Effects of Invention

In order to solve the foregoing problems, an organic electroluminescent element according to the present invention includes: an anode; a cathode; and an organic layer, sandwiched between the anode and the cathode, which contains a positive and negative charge transporting material, the organic layer including a first region doped with an acceptor, a second region doped with a donor, and a third region doped with an organic light-emitting material, the first region being located on the anode, the second region being located on the cathode, the third region being located between the first region and the second region, the acceptor having such a concentration gradient in the first region as to become lower in concentration from the anode toward the third region, the donor having such a concentration gradient in the second region as to become lower in concentration from the cathode toward the third region. This makes it possible to provide a simple-structured, high-luminance, high-efficiency, and long-life organic electroluminescent element.

DESCRIPTION OF EMBODIMENTS

An embodiment of an organic electroluminescent element of the present invention is described below with reference to FIGS. 1 through 3. It should be noted that the term "organic electroluminescent element" is also hereinafter referred to simply as "organic EL element".

[1. First Embodiment of an Organic EL Element]

(Configuration of an Organic El Element)

Figure 1:
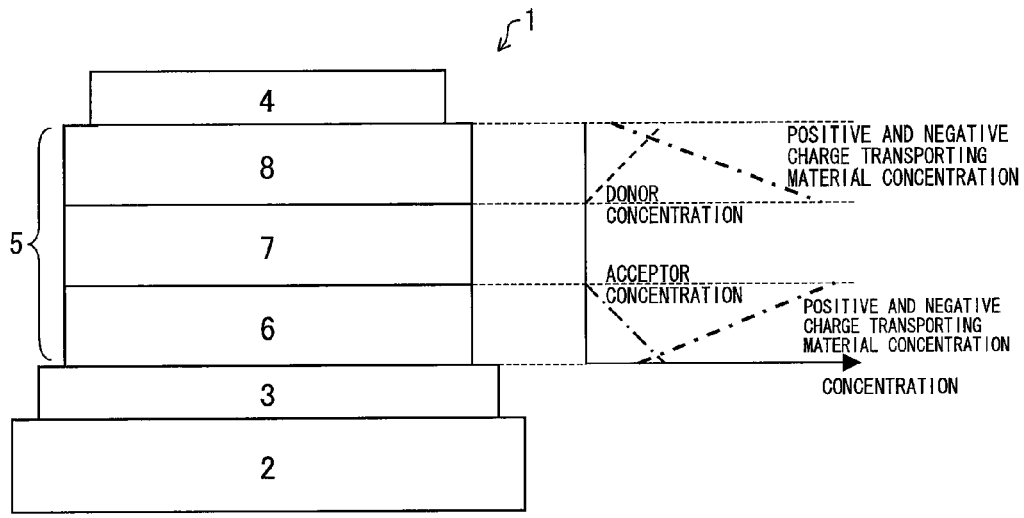
FIG. 1 is a schematic view showing a configuration of an organic electroluminescent element according to a first embodiment of the present invention.

FIG. 1 is a schematic view showing a configuration of an organic EL element according to a first embodiment of the present invention. It should be noted that FIG. 1 shows a graph representing through-thickness concentrations of an acceptor, a donor, and a positive and negative charge transporting material that are contained in layers of an organic EL element 1, in such a manner that the structure of layers and the position of concentrations in the organic EL element 1 correspond to each other. That is, the graph of FIG. 1 uses (i) a straight line to show a donor concentration, (ii) a straight line, intersecting with the straight line (i), to show a positive and negative charge transporting material concentration, (iii) a straight line to show an acceptor concentration, and (iv) a straight line, intersecting with the straight line (iii), to show a positive and negative charge transporting material concentration. The straight line (i) shows the concentration of a donor contained in a donor region 8 to be described later, and the straight line (ii) shows the concentration of a positive and negative charge transporting material contained in the donor region 8. The straight line (iii) shows the concentration of an acceptor contained in an acceptor region 6 to be described later, and the straight line (iv) shows the concentration of a positive and negative charge transporting material contained in the acceptor region 6.

As shown in FIG. 1, the organic EL element 1 according to the present embodiment includes an anode 3, a cathode 4, and an organic EL layer (organic layer) 5.

The organic EL element 1 is a light-emitting element having a single-layer organic EL layer 5. Specifically, the organic EL element 1 includes a single-layer organic EL layer 5 sandwiched between an anode 3 provided on a substrate 2 and a cathode 4.

The anode 3 is an electrode which, when a voltage is applied to it, injects holes into the organic EL layer 5. The cathode 4 is an electrode which, when a voltage is applied to it, injects electrons into the organic EL layer 5. Although, in the present embodiment, the anode 3 is laminated directly on the substrate 2, the cathode 4 may be provided on the substrate 2 instead. That is, the anode 3 and the cathode 4 need only be placed so that the anode 3 functions as one of a pair of electrodes of the organic EL element 1 and the cathode 4 functions as the other one of the pair of electrodes.

The organic EL layer 5 is a single-layer light-emitting layer containing a positive and negative charge transporting material. That is, the organic EL layer 5 transports holes and electrons (hereinafter collectively referred to as "charges" or "carriers") and emits light through the recombination of these charges.

Further, the organic EL layer 5 has an acceptor region (first region) 6 doped with an acceptor, a donor region (second region) 8 doped with a donor, and a light-emitting region (third region) 7 doped with an organic light-emitting material. The acceptor region 6 is located on the anode 3. The donor region 8 is located on the cathode 4. The light-emitting region 7 is located between the acceptor region 6 and the donor region 8.

The following describes each of the components of the organic EL element 1 in more detail.

(Configuration of the Organic EL Layer 5)

As mentioned above, the organic EL layer 5 is a single-layer light-emitting layer provided between the anode 3 and the cathode 4 and has the acceptor region 6 located on the anode 3, the donor region 8 located on the cathode 4, and the light-emitting region 7 located between the acceptor region 6 and the donor region 8. However, an organic EL element according to the present invention is not to be limited to such a configuration and, for example, may include, between the acceptor region 6 and the light-emitting region 7, a positive and negative charge transporting material region containing neither the acceptor nor the organic light-emitting material, and may also include, between the donor region 8 and the light-emitting region 7, a positive and negative charge transporting material region containing neither the donor nor the organic light-emitting material.

The organic EL layer 5 needs only contain the positive and negative charge transporting material and be doped with the acceptor, the donor, and the organic light-emitting material. However, the organic EL layer 5 is not to be limited to such a configuration. For example, the organic EL layer 5 may have these materials dispersed in a polymeric material such as a binder resin or in an inorganic material.

In the acceptor region 6 doped with the acceptor or the donor region 8 doped with the donor, a change in band structure causes a rise in carrier concentration. This allows a sufficient increase in charge injection efficiency in that region and therefore makes it unnecessary to provide a hole injection layer or an electron injection layer between each electrode and the organic EL layer 5.

Further, such a change in band structure in that region brings about a sufficient improvement in charge conductivity. This makes it unnecessary to provide a hole transport layer or an electron transport layer between each electrode and the organic EL layer 5. In this way, even when the organic EL element 1 is configured to include only the organic EL layer 5 between the electrodes, the organic EL element 1 can achieve high-luminance and high-efficiency emission with a simple structure because the organic EL layer 5 functions both as a hole and electron injection layer and a hole and electron transport layer.

The proportion of the acceptor region 6 to the organic EL layer 5 in thickness can fall within any range. For example, assuming that the whole film thickness of the organic EL layer 5 accounts for 100%, it is only necessary that the proportion fall within a range of 90% or less from the anode 3 or, more preferably, 70% or less from the anode 3.

The proportion of the donor region 8 to the organic EL layer 5 in thickness can fall within any range. For example, assuming that the whole film thickness of the organic EL layer 5 accounts for 100%, it is only necessary that the proportion fall within a range of 90% or less from the cathode 4 or, more preferably, 70% or less from the cathode 4. It should be noted that the ranges of proportions of the acceptor region 6 and the donor region 8 in thickness merely indicate the ranges within which the respective proportions can fall. A total of proportions of the acceptor region 6 and the donor region 8 will not exceed 100%.

The proportion of the light-emitting region 7 to the organic EL layer 5 in thickness can fall within any range. For example, assuming that the whole film thickness of the organic EL layer 5 accounts for 100%, it is only necessary that the proportion fall within a range of 50% or less from the center of the organic EL layer 5 or, more preferably, 20% or less from the center of the organic EL layer 5.

Furthermore, it is only necessary that in the acceptor region 6, the acceptor has such a concentration gradient as to become lower in concentration from the anode 3 toward the light-emitting region 7, and that in the donor region 8, the donor has such a concentration gradient as to become lower in concentration from the cathode 4 toward the light-emitting region 7. These concentration gradients may be either sequential or gradual, for example.

That is, in the acceptor region 6, the acceptor is highest in concentration on a side of the acceptor region 6 that is in contact with the anode and becomes lower in concentration toward the light-emitting region 7 doped with the organic light-emitting material. This allows holes having been propagating through the acceptor to efficiently propagate to the positive and negative charge transporting material and, ultimately, allows the holes to completely propagate through the positive and negative charge transporting material in the light-emitting region 7 doped with the organic light-emitting material.

Meanwhile, in the donor region 8, the donor is highest in concentration on a side of the donor region 8 that is in contact with the cathode 4 and becomes lower in concentration toward the light-emitting region 7 doped with the organic light-emitting material. This allows electrons having been propagating through the donor to efficiently propagate to the positive and negative charge transporting material and, ultimately, allows the electrons to completely propagate through the positive and negative charge transporting material in the light-emitting region 7 doped with the organic light-emitting material.

Therefore, the holes and the electrons can be smoothly transported to the light-emitting region 7 doped with the organic light-emitting material and efficiently recombined with each other in that region. This makes it possible to keep high-luminance and high-efficiency emission over a long period of time.

The concentration of the acceptor in the acceptor region 6 is not to be particularly limited. For example, it is only necessary that the concentration fall within a range of 0.1 to 40% by weight or, more preferably, 1 to 20% by weight.

The concentration of the donor in the donor region 8 is not to be particularly limited. For example, it is only necessary that the concentration fall within a range of 0.1 to 40% by weight or, more preferably, 1 to 20% by weight.

It should be noted although it is only necessary that the concentration gradient of the acceptor in the acceptor region 6 and the concentration gradient of the donor in the donor region 8 become lower toward the light-emitting region 7, it is more preferable that the concentration gradient of the acceptor in the acceptor region 6 and the concentration gradient of the donor in the donor region 8 be exponential.

Further, for example, the concentration gradient of the acceptor in the acceptor region 6 may be set up so that the acceptor becomes lower in concentration from the anode 3 toward the light-emitting region 7 in proportion to the square of the distance from the anode 3, and the concentration gradient of the donor in the donor region 8 may be set up so that the donor becomes lower in concentration from the cathode 4 toward the light-emitting region 7 in proportion to the square of the distance from the cathode 4. It should be noted that neither of the concentration gradients is to be limited to the square of the distance from the corresponding electrode and that the concentration gradients may each be set up to become lower in proportion to the nth square (n=1, 2, 3, 4, 5, and so on) of the distance.

This allows the holes and the electrons to more efficiently propagate through the positive and negative charge transporting material of the light-emitting region 7, thus bringing about an improvement in luminous efficiency. Further, a decrease in luminous efficiency along with energy transfer of excitation energy from the light-emitting material to the acceptor and to the donor can be effectively prevented.

Further, it is preferable that in the light-emitting region 7, the organic light-emitting material have such a concentration gradient as to become higher in concentration from sides facing the acceptor region 6 and the donor region 8 toward the center of the light-emitting region 7.

That is, in an interfacial region of the light-emitting region 7 with the acceptor region 6, the organic light-emitting material is low in concentration. This allows holes having been propagating through the acceptor to efficiently propagate to the positive and negative charge transporting material in the interfacial region and, ultimately, allows the holes to completely propagate through the positive and negative charge transporting material in the light-emitting region 7.

Similarly, in an interfacial region of the light-emitting region 7 with the donor region 8, the organic light-emitting material is low in concentration. This allows electrons having been propagating through the donor to efficiently propagate to the positive and negative charge transporting material in the interfacial region and, ultimately, allows the electrons to completely propagate through the positive and negative charge transporting material in the light-emitting region 7.

The concentration of the organic light-emitting material in the light-emitting region 7 is not to be particularly limited. For example, it is only necessary that the concentration fall within a range of 0.1 to 30% by weight or, more preferably, 1 to 20% by weight in an area near the center of the light-emitting region 7.

The film thickness of the organic EL layer 5 is not to be particularly limited and, for example, needs only fall within a range of 1 to 1,000 nm or, more preferably, 10 to 200 nm. For example, when the film thickness is 10 nm or greater, a pixel defect can be prevented from being caused by foreign bodies such as dirt. Further, for example, when the film thickness is 200 nm or less, a rise in drive voltage can be prevented from being caused by a resistance component of the organic EL layer 5.

It should be noted that in order for a microcavity effect (interference effect) to bring about an improvement in color purity, it is only necessary to adjust the film thickness optimally for each desired luminescent color.

(Materials Constituting the Organic EL Layer 5)

Positive and negative charge transporting materials are classified into low-molecular materials and polymeric materials. The organic EL layer 5 can be constituted by any positive and negative charge transporting material. For example, the organic EL layer 5 can be constituted by a publicly known positive and negative charge transporting material for use in organic EL.

Examples of low-molecular materials include: benzofuran derivatives such as bis(carbazolyl)benzodifuran (CZBDF); cyclopentadiene derivatives; tetraphenylbutadiene derivatives; triphenylamine derivatives; oxadiazole derivatives; basophenanthroline derivatives; pyrazoloquinoline derivatives; styrylbenzene derivatives; styrylarylene derivatives; aminostyryl derivatives; silole derivatives; thiophene cyclic compounds; pyridine cyclic compounds; perinone derivatives; perylene derivatives; oligothiophene derivatives; coumarin derivatives; rubrene derivatives; quinacridone derivatives; squarium derivatives; porphyrin derivatives; styryl-based pigments; tetracene derivatives; pyrazoline derivatives; trifumanylamine derivatives; anthracene derivatives; diphenylanthracene derivatives; pyrene derivatives; carbazole derivatives; oxadiazole dimers; pyrazoline dimers; aluminum quinolinol complexes; benzoquinolinol beryllium complexes; benzooxazole zinc complexes; benzothiazole zinc complexes; azomethyl zinc complexes; porphyrin complexes; europium complexes, iridium complexes; platinum complexes; metal complexes each having Al, Zn, Be, Pt, Ir, Tb, Eu, Dy, etc. as its central metal and having an oxadiazole structure, a thiadiazole structure, a phenylpyridine structure, a phenylbenzimidazole structure, a quinoline structure, or the like as its ligand; and the like.

Further, examples of polymeric materials include poly (oxadiazole) (Poly-OXZ), polystyrene derivatives (PSS), polyaniline-camphorsulfonic acid (PANI-CSA), poly(triphenylamine-oxadiazole) derivatives (Poly-TPD-OXD), poly (carbazole-triazole) derivatives (Poly-Cz-TAZ), and the like.

Since, for high-efficiency emission, it is necessary to confine excitation energy into a phosphorescent light-emitting material, it is preferable that the positive and negative charge transporting material have a singlet excitation level ($S_1$) that is higher in excitation level than the triplet excitation level ($T_1$) of the phosphorescent light-emitting material. That is, it is more preferable that the following relationship hold: $S_1$ (positive and negative charge transporting material)>$T_1$ (organic light-emitting material). Therefore, it is more preferable that the positive and negative charge transporting material be a carbazole group, a triazole group, or a benzofuran group, which are high in excitation level and hole mobility.

Alternatively, the organic EL layer 5 may have the aforementioned materials dispersed in another material examples of which include, but are not to be particularly limited to, polymeric materials such as polyvinyl carbazole, polycarbonate, polyethylene terephthalate and inorganic materials such as silicon oxide and tin oxide.

The acceptor is not to be particularly limited and may be made of a publicly known acceptor material for use in organic EL. Examples of acceptor materials include: inorganic materials such as gold (Au), platinum (Pt), tungsten (W), iridium (Ir), $POCl_3$, $AsF_6$, chloride (Cl), barium (Br), iodine (I), vanadium oxide ($V_2O_5$), and molybdenum oxide ($MoO_2$); compounds having cyano groups, such as TCNQ (7,7,8,8,-tetracyanoquinodimethane), $TCNQF_4$ (tetrafluorotetracyanoquinodimethane), TCNE (tetracyanoethylene), HCNB (hexanecyanobutadiene), and DDQ (dicyclodicyanobenzoquinone); compounds having nitro groups, such as TNF (trinitrofluorenone) and DNF (dinitrofluorenone); and organic materials such as fluoranil, chloranil, and bromanil.

Among these acceptor materials, a compound having a cyano group, such as TCNQ, $TCNQF_4$, TCNE, HCNB, DDQ, is more preferably used for a more effective increase in carrier concentration.

The donor is not to be particularly limited and may be made of a publicly known donor material for use in organic EL. Examples of donor materials include: inorganic materials such as alkali metals, alkali earth metals, rare earth elements, Al (aluminum), Ag (silver), Cu (copper), and In (indium); compounds each having an aromatic tertiary amine as its skeleton, such as anilines, phenylenediamines, benzidine (such as N,N,N',N'-tetraphenylbenzidine, N,N'-bis-(3-methylphenyl)-N,N'-bis-(phenyl)-benzidine, N,N'-di-(naphthalene-1-yl)-N,N'-diphenyl-benzidine), triphenylamines (such as triphenylamine, 4,4',4"-tris(N,N-diphenyl-amino)-triphenylamine, 4,4',4"-tris(N-3-methylphenyl-N-phenyl-amino)-triphenyl amine, 4,4',4"-tris(N-(1-naphtyl)-N-phenyl-amino)-triphenylamine), and triphenyldiamines (such as N,N'-di-(4-methyl-phenyl)-N,N'-diphenyl-1,4-phenylenediamine); condensed polycyclic compounds such as phenanthrene, pyrene, perylene, anthracene, tetracene, and pentacene (Note, however, that such a condensed polycyclic compound may have a substituent); and organic materials such as TTFs (tetrathiafulvalenes), dibenzofuran, phenothiazine, and carbazole.

Among these donor materials, a compound having an aromatic tertiary amine as its skeleton, a condensed polycyclic compound, or an alkali metal is more preferably used for a more effective increase in carrier concentration.

Further, the organic EL layer 5 can be constituted by any organic light-emitting material. For example, the organic EL layer 5 can be constituted by a publicly known organic light-emitting material for use in organic EL.

Examples of such organic light-emitting materials include: fluorescent materials such as styryl derivatives, perylene, iridium complexes, coumarin derivatives, Lumogen F Red, dicyanomethylnepyran, phenoxazone, and porphyrin derivatives; phosphorescent light-emitting organic metal complexes such as bis[(4,6-difluorophenyl)-pyridinato-N,C2'] picolinate iridium (III) (FIrpic), tris(2-phenylpyridyl) iridium (III) (Ir(ppy)$_3$), tris(1-phenylisoquinoline) iridium (III) (Ir(piq)$_3$), and tris(biphenylquinoxalinato) iridium (III) (Q3Ir); and the like.

For the purpose of drastically reducing power consumption, it is more preferable that the organic light-emitting material be a phosphorescent light-emitting material.

It is preferable that the proportion of the acceptor material to be added to the positive and negative charge transporting material be for example 0.1 to 50% by weight or, more preferably, 1 to 20% by weight. Further, it is preferable that the proportion of the donor material to be added to the positive and negative charge transporting material be for example 0.1 to 50% by weight or, more preferably, 1 to 20% by weight. Furthermore, it is preferable that the proportion of the organic light-emitting material to be added to the positive and negative charge transporting material be for example 0.1 to 50% by weight or, more preferably, 1 to 20% by weight.

Further, it is more preferable that the proportion of the organic light-emitting material to be added to the positive and negative charge transporting material be smaller than the proportion of the acceptor material to be added to the positive and negative charge transporting material. This allows the organic EL layer 5 to effectively achieve both high hole and electron injection capability and high luminous efficiency.

(Method for Forming an Organic EL Layer 5)

Examples of methods for forming an organic EL layer 5 include publicly known wet processes, publicly known dry processes, heat transfer, laser transfer, etc.

Examples of wet processes include: coating methods such as spin coating, dipping, a doctor blade method, spray coating; and printing methods such as ink jet printing, relief printing, intaglio printing, screen printing, microgravure coating, and nozzle printing.

In forming an organic EL layer 5 by using any of these wet processes, it is only necessary to use an organic-EL-layer-forming coating liquid obtained by dissolving and dispersing the aforementioned materials in a solvent such as a leveling agent. Further, it is possible to use additives to adjust the properties of the coating liquid. For the purpose of improving the uniformity of the resulting coating film, usable examples of additives include acetone, chloroform, toluene, xylene, trimethyl benzene, tetramethyl benzene, chlorobenzene, dichlorobenzene, diethyl benzene, cymene, tetralin, cyclohexyl benzene, dodecyl benzene, isopropyl benzene, diisopropyl benzene, isopropylxylene, t-butyl xylene, methylnaphthalene, etc. Further, for the purpose of adjusting viscosity, usable examples of additives include anisole, dimethoxybenzene, trimethoxybenzene, methoxytoluene, dimethoxytoluene, trimethoxytoluene, dimethyl anisole, trimethyl anisole, ethyl anosole, propyl anisole, isopropyl anisole, butyl anisole, methyl ethyl anisole, ethoxyether, butoxyether, benzyl methyl ether, benzyl ethyl ether, etc.

Further, examples of dry processes include vacuum evaporation, electron beam (EB) evaporation, molecular beam epitaxy (MBE), sputtering, organic vapor-phase deposition (OVPD), etc.

Furthermore, an organic EL layer 5 may be formed by using a method for, while moving a substrate 2 along a series arrangement of evaporation sources (supply means) respectively filled with an acceptor, a positive and negative charge transporting material, an organic light-emitting material, and a donor, depositing the acceptor, the organic light-emitting material, and the donor from the respective evaporation sources onto the substrate 2.

Figure 2:
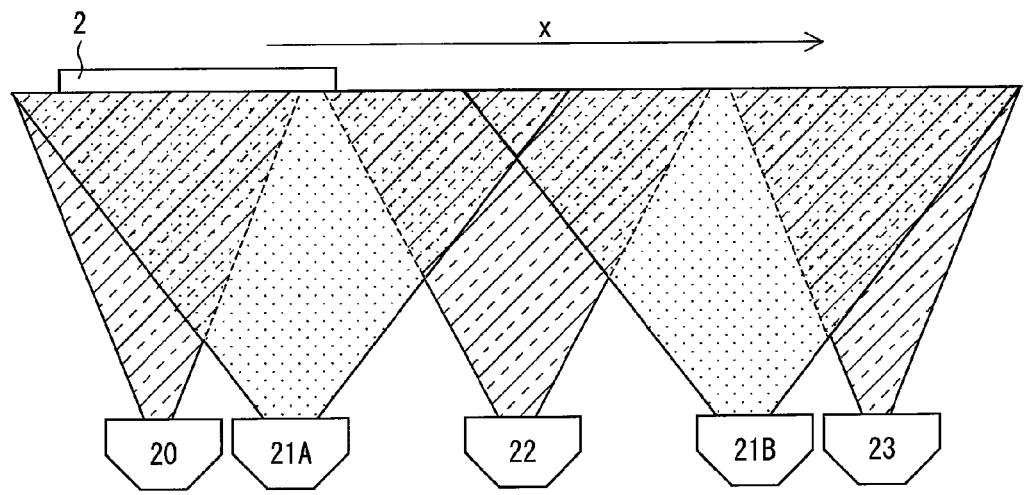
FIG. 2 is an explanatory diagram showing a method for forming an organic EL layer in an organic electroluminescent element of the present invention.

For example, an evaporation source 20 filled with an acceptor, evaporation sources 21A and 21B filled with a positive and negative charge transporting material, an evaporation source 22 filled with an organic light-emitting material, and an evaporation source 23 filled with a donor may be horizontally and serially arranged as shown in FIG. 2. FIG. 2 is an explanatory diagram showing a method for forming an organic EL layer 5 in an organic EL element 1 of the present embodiment, with a side view of the horizontally-arranged evaporation sources.

The materials evaporate in an upward direction from the respective evaporation sources thus arranged. Therefore, by conveying a substrate 2 in a direction along which the evaporation sources are arranged (in an "x" direction in FIG. 2) such that a side of the substrate 2 onto which the materials from the evaporation sources are to be deposited faces the evaporation sources, the acceptor, the positive and negative charge transporting material, the organic light-emitting material, the positive and negative charge transporting material, and the donor can be formed as films in this order over the substrate 2. Use of such an in-line evaporation apparatus allows more efficient production.

It should be noted that the direction in which the materials evaporate from the respective evaporation sources is not to be limited to the upward direction and may for example be a downward direction or a horizontal direction. That is, the materials may evaporate in any direction, whether it is upward, downward, leftward, or rightward, from the respective evaporation sources.

However, it is more preferable that when the evaporation sources are horizontally arranged, the materials evaporate in a vertical downward direction or a horizontal direction from the evaporation sources. In this case, forming an organic EL layer 5 while moving a substrate 2 along a side onto which the materials are supplied makes it unnecessary to suspend a shadow mask for use in coating of separate colors in a production line, for example, in a case where full-color organic EL elements are manufactured. This makes it possible to reduce bending of the mask due to suspension. This makes it possible to carry out patterning with use of the mask in a case where EL elements are fabricated on a large-sized substrate. This results in an improvement in productivity and a reduction in cost.

It should be noted that the method for manufacturing an organic EL element 1 is not to be limited to this. For example, an organic EL element 1 may be manufactured by using an evaporation apparatus including (i) crucibles filled with an acceptor, an organic light-emitting material, a donor, and a positive and negative charge transporting material, (ii) planar evaporation sources connected to the crucibles, respectively, and (iii) valves provided between the crucibles and the planer evaporation sources so as to control vapors of organic materials, respectively.

This evaporation apparatus employs such a method that films are formed over a substrate placed above, below, or vertically to the planar evaporation sources. Even with a method for forming films by using such an evaporation apparatus, an organic EL layer 5 is formed by conveying the substrate along the evaporation sources. This makes it possible to more efficiently produce an EL organic element 1.

Furthermore, it is more preferable that the substrate be conveyed below or in a direction vertical to the evaporation sources, because such conveyance of the substrate eliminates the need to suspend a mask for use in separate coating and allows mask patterning even when a large-sized substrate is used.

(Configuration of the Electrodes)

The electrodes constituting the organic EL element 1 need only function in pairs as the anode 3 and the cathode 4 do.

Each of the electrodes may be a single-layer structure made of a single electrode material or a laminated structure made of a plurality of electrode materials. Usable examples of electrode materials for the electrodes of the organic EL element 1 include, but are not to be particularly limited to, publicly known electrode materials.

A preferred example of an electrode material for the anode is an electrode material that can efficiently inject holes into the organic EL layer 5 and has a work function of 4.5 or greater, and a preferred example of an electrode material for the cathode is an electrode material that can efficiently inject electrons into the organic EL layer 5 and has a work function of 4.5 or less.

Examples of electrode materials having a work function of 4.5 or greater include: metals such as gold (Au), platinum (Pt), and nickel (Ni); and transparent electrode materials such as an oxide (ITO) composed of indium (In) and tin (Sn), an oxide ($SnO_2$) of tin (Sn), and an oxide (IZO) composed of indium (In) and zinc (Zn).

Examples of electrode materials having a work function of 4.5 or less include: metals such as lithium (Li), calcium (Ca), cerium (Ce), barium (Ba), and aluminum (Al); and alloys containing these metals such as a Mg:Ag alloy and a Li:Al alloy.

It should be noted that for efficient hole and electron injection, it is necessary that the anode of a conventional EL element be made of such an electrode material having a work function of 4.5 or greater and the cathode thereof be made of such an electrode material having a work function of 4.5 or less.

However, since, in the organic EL element 1 according to the present embodiment, the acceptor region 6 of the organic EL layer 5 is doped with the acceptor and the donor region 8 is doped with the donor, a change in band structure brings about an improvement in electron injection efficiency. Therefore, the anode 3 may be made of an electrode material having a work function of 4.5 or less, and the cathode 4 may be made of an electrode material having a work function of 4.5 or greater.

Examples of method for forming the electrodes include, but are not to be particularly limited to, publicly known methods such as EB evaporation, sputtering, ion plating, and resistance heating evaporation.

Further, it is also possible to pattern the resulting electrodes by photolithography or laser ablation as needed. Furthermore, it is also possible to from directly patterned electrodes by combining any of the above public known methods with a shadow mask.

It is preferable that each of the electrodes have, but be not to be particularly limited to, a film thickness of 50 nm or greater. For example, when each of the electrodes has a film thickness of 50 nm or greater, a rise in drive voltage due to an increase in wiring resistance can be prevented.

It should be noted that emitted light obtained in the organic EL layer 5 may be taken out through one of the electrodes, i.e., may be radiated outward. In this case, it is preferable to use a transparent electrode as the electrode through which the emitted light is taken out. Especially preferred examples of transparent electrode materials for the transparent electrode include, but are not to be particularly limited to, ITO and IZO.

It is preferable that the transparent electrode have a film thickness ranging for example from 50 to 500 nm or, more preferably, from 100 to 300 nm. For example, when the transparent electrode has a film thickness of 50 nm or greater, a rise in drive voltage due to an increase in wiring resistance can be prevented. Further, when the transparent electrode has a film thickness of 500 nm or less, a decrease in luminance can be prevented without a decrease in light transmission.

In order for a microcavity effect (interference effect) to bring about an improvement in color purity or in luminous efficiency, it is preferable to use a translucent electrode as the electrode through which the emitted light is taken out. Usable examples of electrode materials for the translucent electrode include a single metal translucent electrode material and a combination of a metal translucent electrode material and a transparent electrode material. From a point of view of reflectivity and transmissivity, it is preferable to use silver as such a translucent electrode material.

It is preferable that the translucent electrode have a film thickness ranging for example from 5 to 30 nm. For example, when the translucent electrode has a film thickness of 5 nm or greater, light can be sufficiently reflected, so that a sufficient interference effect can be obtained. Further, when the translucent electrode has a film thickness of 30 nm or less, there is no rapid decrease in light transmission, so that a decrease in luminance and luminous efficiency can be prevented.

Further, in a case where the emitted light obtained the organic EL layer 5 is taken out through the anode 3 (or the cathode 4), it is preferable that the cathode 4 (or the anode 3), which is the other electrode, be made of an electrode material that does not transmit light. Usable examples of such electrode materials include: black electrode materials such as tantalum and carbon; reflecting metal electrode materials such as aluminum, silver, gold, an aluminum-lithium alloy, an aluminum-neodymium alloy, and an aluminum-silicon alloy; and a combination of a transparent electrode material and such a reflecting metal electrode (reflecting electrode) material.

[2. Second Embodiment of an Organic EL Element]

Next, a second embodiment of an organic EL element according to the present invention is described. FIG. 3 is a schematic view showing a configuration of an organic electroluminescent element according to the second embodiment of the present invention. It should be noted that FIG. 3 shows a graph representing through-thickness concentrations of an acceptor, a donor, and a positive and negative charge transporting material that are contained in layers of an organic EL element 10, in such a manner that the structure of layers and the position of concentrations in the organic EL element 10 correspond to each other. That is, the graph of FIG. 3 uses (i) a straight line to show a donor concentration, (ii) a straight line, intersecting with the straight line (i), to show a positive and negative charge transporting material concentration, (iii) a straight line to show an acceptor concentration, and (iv) a straight line, intersecting with the straight line (iii), to show a positive and negative charge transporting material concentration. The straight line (i) shows the concentration of a donor contained in a donor region 17 to be described later, and the straight line (ii) shows the concentration of a positive and negative charge transporting material contained in the donor region 17 and a positive and negative transporting material region 16 to be described later. The straight line (iii) shows the concentration of an acceptor contained in an acceptor region 13 to be described later, and the straight line (iv) shows the concentration of a positive and negative charge transporting material contained in the acceptor region 13 and a positive and negative transporting material region 14 to be described later.

Figure 3:
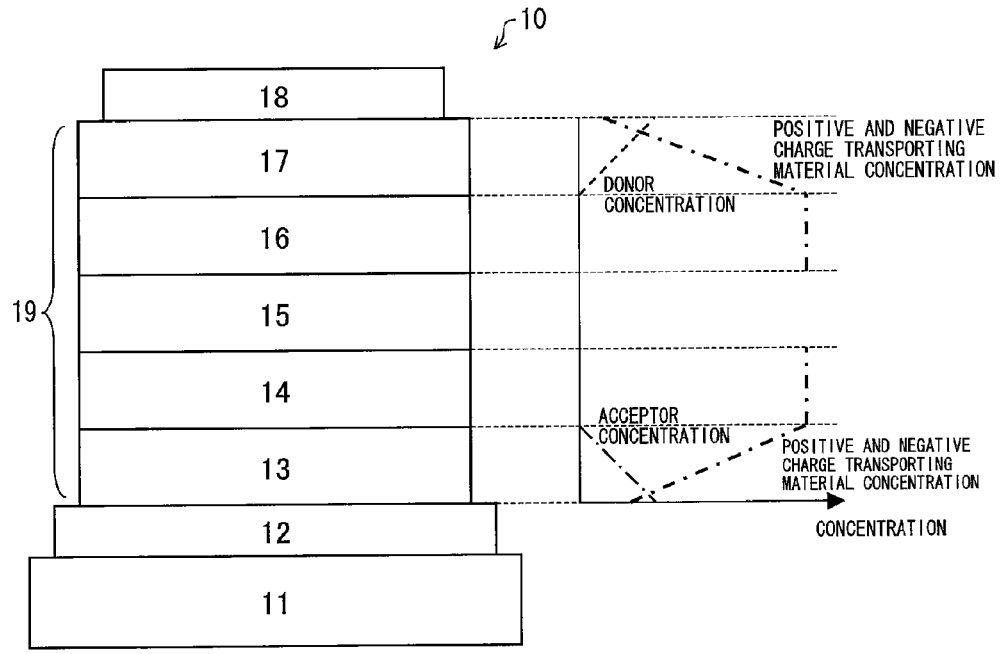
FIG. 3 is a schematic view showing a configuration of an organic electroluminescent element according to a second embodiment of the present invention.

As shown in FIG. 3, the organic EL element 10 according to the present embodiment includes an anode 12, a cathode 18, and an organic EL layer 19. It should be noted that the organic EL element 10 according to the present embodiment is different in configuration from Embodiment 1 only in terms of the organic EL layer 19 and otherwise identical in configuration to Embodiment 1.

The organic EL element 10 according to the present embodiment includes the positive and negative transporting material region 14, sandwiched between the acceptor region 13 and a light-emitting region 15 of the organic EL layer 19, which contains neither an acceptor nor an organic light-emitting material. Further, the organic EL element 10 according to the present embodiment includes the positive and negative transporting material region 16, sandwiched between the donor region 17 and the light-emitting region 15, which contains neither a donor nor an organic light-emitting material.

That is, before being injected into the light-emitting region 15 doped with the organic light-emitting material, holes transported from the acceptor region 13 pass through the positive and negative transporting material region 14 containing neither the acceptor nor the organic light-emitting material. This prevents direct contact between the organic light-emitting material and the acceptor, thereby preventing exciters generated in the organic light-emitting material from being deactivated by making an energy transfer to the acceptor. This makes it possible to effectively achieve high luminous efficiency.

Further, before being injected into the light-emitting region 15 doped with the organic light-emitting material, electrons transported from the donor region 17 pass through the positive and negative transporting material region containing neither the donor nor the organic light-emitting material. This prevents direct contact between the organic light-emitting material and the donor, thereby preventing exciters generated in the organic light-emitting material from being deactivated by making an energy transfer to the donor. This makes it possible to effectively achieve high luminous efficiency.

It is preferable that each of the positive and negative transporting material regions 14 and 16 have, but be not particularly limited to, a film thickness ranging from 5 to 30 nm. When the film thickness of each of the positive and negative transporting material regions 14 and 16 falls within this range, the injection and transport of holes and electrons are facilitated, so that high characteristics (maximum luminance, high efficiency, long life, low drive voltage, etc.) can be obtained.

It should be noted that the positive and negative transporting material regions 14 and 16 may be provided on the acceptor region 13 and the donor region 17, respectively or either the positive and negative transporting material region 14 or 16 may be provided.

[3. Organic EL Display Device]

Figure 4:
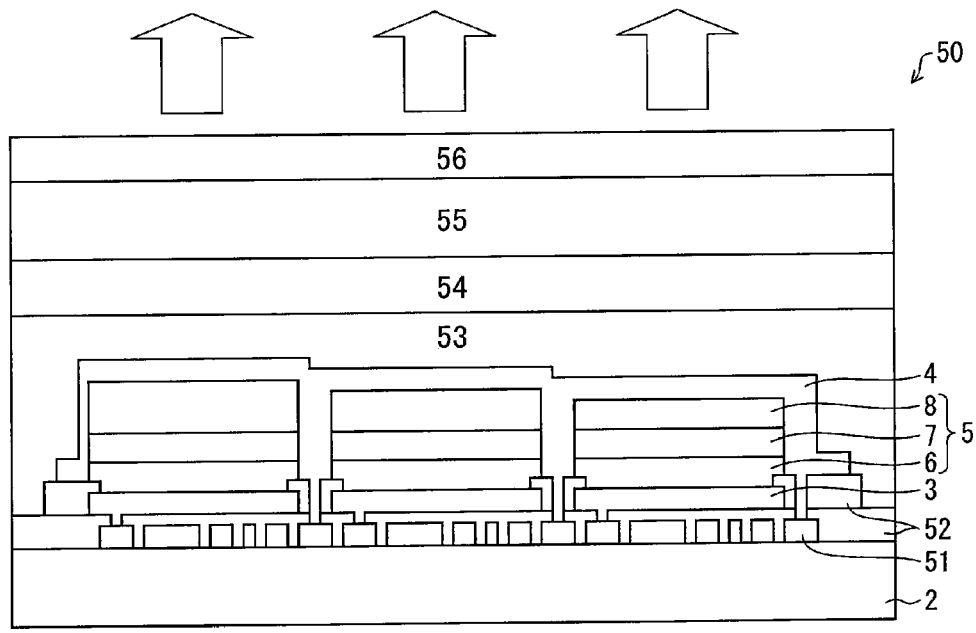
FIG. 4 is a schematic view showing a configuration of an organic electroluminescent display according to an embodiment of the present invention.
Figure 5:
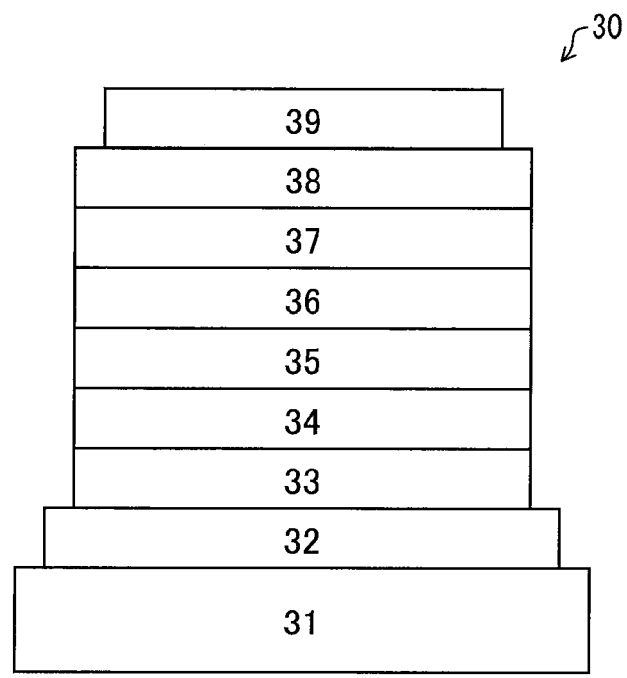
FIG. 5 is a schematic view showing a configuration of a conventional organic electroluminescent element.
Figure 6:
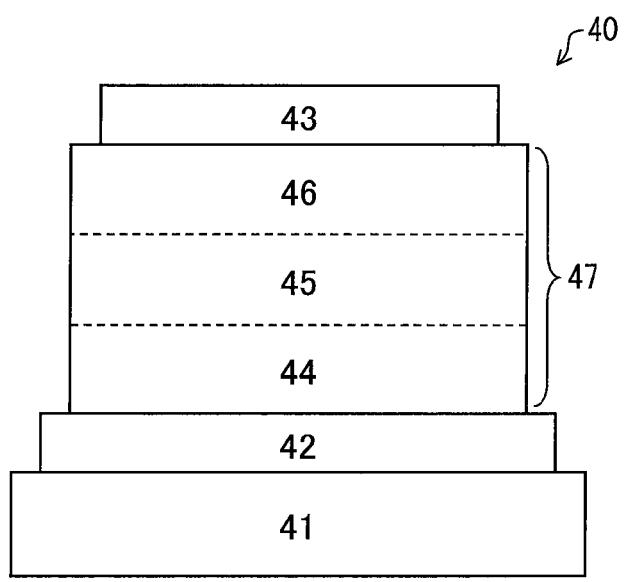
FIG. 6 is a schematic view showing a configuration of a conventional organic electroluminescent element.

Next, an embodiment of an organic EL display device according to the present invention is described below with reference to FIG. 4. FIG. 4 is a schematic view showing a configuration of an organic EL panel (display means) according to an embodiment of the present invention.

The organic EL display device according to the present embodiment is an active-matrix display device including such an organic EL element 1 as that described above. Specifically, the organic EL display device according to the present embodiment includes an organic EL panel 50 constituted by a plurality of organic EL elements 1 laminated on an active-matrix substrate on which TFTs (thin-film transistors) have been formed.

(Configuration of the Organic EL Panel 50)

As shown in FIG. 4, the organic EL panel 50 according to the present embodiment includes a substrate 2, anodes 3, cathodes 4, organic EL layers 5, TFT circuits/wires 51, an interlayer insulating film 52, a sealing film 53, a resin film 54, a sealing substrate 55, and a polarizer 56.

The substrate 2, on an upper surface of which the TFT circuits/wires 51 are provided, functions as an active-matrix substrate.

The active-matrix substrate includes: a plurality of scanning signal lines disposed on the substrate 2, which serves as a base material; a plurality of data signal lines disposed on the substrate 2; and TFTs disposed at intersections between the scanning signal lines and the data signal lines. Further, with a pair of two rows of active-matrix drive elements thus configured, the scanning signal lines are disposed above and below each other.

The active-matrix substrate has a switching TFT and a driving TFT for each pixel, and an interlayer insulating film 32 and a planarizing layer (not illustrated) are formed in this order over the TFTs. Among these TFTs, the driving TFT is electrically connected to an anode 3 via a contact hole formed in the planarizing layer. Further provided in each single pixel is a retention capacitor connected to a gate part of the driving TFT. This retention capacitor retains the gate potential of the driving TFT at a constant potential.

Further, the organic EL layers 5 need only be juxtaposed or laminated on the plurality of anode 3 placed on the active-matrix substrate. It should be noted here that preferred examples of organic EL layers 5 for use in an organic EL panel are, but are not to be particularly limited to, red, green, and blue organic EL layers 5. This makes it possible to achieve a full-color organic EL display device. Each of these organic EL layers 5 functions as an organic EL element 1 by having a cathode 4 provided on that organic EL layer 5.

It should be noted that the organic EL panel 50 according to the present embodiment is driven by a voltage-driven digital gradation method. However, this does not imply any limitation. For example, the organic EL panel 50 according to the present embodiment may be driven by a current-driven analog gradation method.

The number of TFTs is not to be particularly limited, and it is possible to use two TFTs to drive each organic EL element 1 or use two or more TFTs to drive each organic EL element 1. Use of two or more TFTs prevents variation among the TFTs.

Further, in order to protect uppermost surfaces of the organic EL elements 1, i.e., surfaces of the cathodes 4 that are not in contact with the active-matrix substrate, it is possible to provide either the sealing film 53 on the cathodes 4 or the sealing substrate 55 via the resin film 54. This makes it possible to protect the organic EL elements 1 from moisture and the like.

Furthermore, the organic EL panel 50 may include the polarizer 56 on the sealing substrate 55. This makes it possible to improve the contrast of the organic EL panel 50.

Next, the components of the organic EL panel 50 according to the present embodiment are described in detail.

(Substrate 2)

Examples of the substrate 2 include: an inorganic material substrate containing glass, quartz, or the like; a plastic substrate containing polyethylene terephthalate, polycarbazole, or polyimide; an insulating substrate such as a ceramic substrate containing alumina or the like; a substrate obtained by coating a surface of a metal substrate containing aluminum (Al), iron (Fe), or the like with an insulator containing silicon oxide ($SiO_2$), an organic insulating material, or the like; a substrate obtained by subjecting a surface of a metal substrate containing Al or the like to insulating treatment by a method such as anodization; and the like.

It should be noted here that in a case where a polysilicon TFT is formed by a low-temperature process for active-matrix driving of each organic EL element 1, it is more preferable that the substrate 2 be a substrate that neither melts nor distorts at a temperature of 500° C. or lower. Furthermore, in a case where such a polysilicon TFT is formed by a high-temperature process, it is more preferable that the substrate 2 be a substrate that neither melts nor distorts at a temperature of 1,000° C. or lower.

Further, in a case where emitted light obtained in the organic EL panel 50, e.g., in each organic EL layer 5 is taken out through a side of the organic EL element 1 that is not in contact with the active-matrix substrate, i.e., through the cathode 4 (in the direction of arrows above the polarizer 56 in FIG. 4), the substrate 2 is made of any material; however, in a case where the emitted light is taken out through the electrode that is in contact with the active-matrix substrate, i.e., through the anode 3, it is preferable that the substrate 2 be made of a transparent or translucent substrate material.

(TFT Circuits/Wires 51)

It is only necessary to use publicly known TFTs as the TFTs, and it is possible to use metal-insulator-metal (MIM) diodes instead of the TFTs.

Further, the TFTs can be formed by using a publicly known material, structure, and forming method. Examples of materials for the active layer of each TFT include: inorganic semiconductor materials such as amorphous silicon, polycrystalline silicon (polysilicon), microcrystalline silicon, and cadmium selenide; and organic semiconductor materials such as polythiophene derivatives, thiophene oligomers, poly(p-phenylenevinylene) derivatives, naphthacene, and pentacene. Further, examples of the structure of each TFT include a staggered structure, an inverted-staggered structure, a top-gate structure, and a coplanar structure.

Examples of methods for forming an active layer that constitutes a TFT include: a method for ion-doping an impurity into an amorphous silicon film formed by plasma-excited chemical vapor deposition (PECVD); a method for forming amorphous silicon by low-pressure chemical vapor deposition (LPCVD) using a silane ($SiH_4$) gas, for crystallizing the amorphous silicon by solid-phase deposition to form polysilicon, and for doping ions into the polysilicon by ion implantation; a method (low-temperature process) for forming amorphous silicon by LPCVD using a $Si_2H_6$ gas or by PECVD using $SiH_4$ gas, for annealing the amorphous silicon with a laser such as an excimer laser, for crystallizing the amorphous silicon to form polysilicon, and for doping ions into the polysilicon; a method (high-temperature process) for forming a polysilicon layer by LPCVD or PECVD, for forming a gate insulating film by thermally oxidizing the polysilicon layer at 1,000° C. or higher, for forming an n+ polysilicon gate electrode on the polysilicon layer, and for doping ions; a method for forming an organic semiconductor material by ink jet printing; a method for obtaining a single-crystal film of an organic semiconductor material; and the like.

The gate insulating film of each TFT can be formed by using a publicly known material, examples of which include: $SiO_2$ formed by PECVD, LPCVD, or the like; $SiO_2$ obtained by thermally oxidizing polysilicon; and the like. Further, a signal electrode wire, a scanning electrode wire, a common electrode wire, a first drive electrode, and a second drive electrode for use in each TFT of the organic EL panel 50 according to the present embodiment can be formed by using a publicly known material, examples of which include tantalum (Ta), aluminum (Al), copper (Cu), and the like. The TFTs of the organic EL panel according to the present embodiment can be formed to have such a configuration as that described above, but are not to be limited to these materials, structures, and forming methods.

(Interlayer Insulating Film 52)

The interlayer insulating film 52 needs only be made of a publicly known material, examples of which include: inorganic materials such as silicon oxide ($SiO_2$), silicon nitride (SiN or $Si_2N_4$), and tantalum oxide (TaO or $Ta_2O_5$); organic materials such as acrylic resin and resist materials; and the like.

Examples of methods for forming the interlayer insulating film 52 include publicly dry processes such as chemical vapor deposition (CVD) and vacuum evaporation and wet processes such as spin coating. Further, it is possible to carry out patterning by photolithography or the like as needed.

Further, in a case where emitted light obtained in each organic EL layer 5 is taken out through a side of the organic EL element 1 that is not contact with the active-matrix substrate, i.e., through the cathode 4, it is preferable that the interlayer insulating film 52 be a light-blocking insulating film having a light-blocking effect. Thus, even if outside light enters a TFT formed on the substrate, a change in TFT characteristic can be prevented.

Examples of light-blocking interlayer insulating films include: one obtained by dispersing a pigment or dye such as phthalocyanine or quinacridone in polymer resin such as polyimide; color resists; black matrix materials, inorganic insulating materials such as $NixZnyFe_2O_4$; and the like. It should be noted that the interlayer insulating film may be any of these insulating films or light-blocking insulating films or a combination of them. The interlayer insulating film of the organic EL panel according to the present embodiment can be formed to have such a configuration as that described above, but is not to be limited to these materials, structures, and forming methods.

(Planarizing Film)

The formation of the TFTs and the like on the substrate 2 causes the surface of the substrate to be uneven. In order to prevent the occurrence of a defect in an organic EL element 1 due to such unevenness (e.g., a defect in a pixel electrode, a defect in an organic EL layer, a breakage in a counter electrode, a short circuit between a pixel electrode and a counter electrode, a decrease in resistance to pressure, etc.), a planarizing film may be provided on the interlayer insulating film 52.

The planarizing film can be made of a publicly known material, examples of which include: inorganic materials such as silicon oxide, silicon nitride, and tantalum oxide; organic materials such as polyimide, acrylic resin, resist materials; and the like.

Examples of methods for forming the planarizing film include dry processes such as CVD and vacuum evaporation and wet processes such as spin coating. However, the present invention is not to be limited to these materials and forming methods. Further, the planarizing film may have a single-layer structure or a multilayer structure.

(Organic EL Element 1)

Each of the organic EL elements 1 of the organic EL panel 50 according to the present embodiment needs only include a single-layer organic EL layer 5. However, none of the organic EL elements 1 is to be limited to the aforementioned configuration. For example, an insulating edge cover for preventing a leak may be provided in that edge portion of an electrode which is in contact with a surface of active-matrix substrate. In a case where the organic EL elements 1 are fabricated by a wet process, an insulating separating wall for retaining a coating liquid to be applied may be provided.

(Polarizer 56)

Further, the organic EL panel 50 of the present invention may have the polarizer 56 provided on a side through which emitted light obtained in the organic EL layers 5 is taken out. A more preferred example of the polarizer 56 is, but is not to be limited to, a combination of a conventional linear polarizer and a quarter wavelength plate. The provision of the polarizer 56 brings about an improvement in contrast of the organic EL panel 50.

(Sealing Film 53, Sealing Substrate 55)

It is preferable that the organic EL panel 50 according to the present embodiment have a sealing structure including the sealing film 53 or the sealing substrate 55. The sealing structure may for example be configured by a combination of the sealing film 53 and the sealing substrate 55 or configured by using only either the sealing film 53 or the sealing substrate 55.

The sealing film 53 is for example an inorganic film, a resin film, or the like, and the sealing substrate 55 is for example a glass substrate or the like. It should be noted that in case where emitted light obtained in the organic EL layers 5 is taken out through a side on which a sealing layer has been formed, it is preferable that the sealing film 53 or the sealing substrate 55 be made of a transparent material.

Examples of methods for forming the sealing film 53 and the sealing substrate 55 include, but are not to be particularly limited to, publicly known methods with use of publicly known materials, examples of which include: a method for sealing in an inert gas such as a nitrogen gas or an argon gas with glass, metal, or the like; a method of mixing an absorbent or the like such as barium oxide into an inert gas that has been sealed in; and the like. Another example of a method for forming the sealing film 53 is to apply or join resin onto the electrodes by spin coating, ODF (one drop fill), or lamination.

The provision of the sealing structure on the electrodes makes it possible to prevent external oxygen or moisture from entering the organic EL elements 1, thereby extending the life of the organic EL elements 1. It should be noted that neither the materials for nor the method for forming the sealing film 53 or the sealing substrate 55 is to be so limited.

It should be noted that the present invention is not to be limited to the organic EL display device described above, and an organic EL lighting device including an organic EL element according to the present invention is also encompassed in the scope of the present invention.

EXAMPLES

In the following, the present invention is described on the basis of examples. It should be noted, however, that the present invention is not limited to these examples.

Example 1

Evaluation of the Electrical Characteristics of an Organic Electroluminescent Element according to the Present Invention In Example 1, an organic EL element was fabricated in the following manner, and its electrical characteristics were evaluated.

(Fabrication of an Organic EL Element)

First, a transparent substrate on a surface of which a 50 mm×50 mm indium tin oxide (ITO) having a surface resistance of 10Ω/□ had been formed was used. The ITO, which would serve as an anode, was patterned into a stripe 2 mm in width. Next, the substrate was subjected to water washing, was further subjected to ten minutes of pure water ultrasonic washing, ten minutes of acetone ultrasonic washing, and five minutes of isopropyl alcohol steam washing, and was dried for one hour at 100° C. After that, the substrate was fixed to a substrate holder provided inside of a resistance heating evaporation apparatus, and the pressure was reduced to a vacuum of $1 \times 10^{-4}$ Pa or lower.

Next, on the substrate, a positive and negative charge transporting light-emitting layer (organic EL layer) 100 nm in film thickness was formed. It should be noted here that the positive and negative charge transporting material used was bis(carbazolin)benzodifuran (CZBDF), that the acceptor used was tetrafluorotetracyanoquinodimethane ($TCNQF_4$), that the organic light-emitting material used was tris(2-phenylpyridine) iridium (III) ($Ir(ppy)_3$), and that the donor used was tetrathiafulvalene (TTF).

Further, a region in the positive and negative charge transporting light-emitting layer which extended from the anode to a position at a distance of 40 nm from the anode was doped with the acceptor by co-evaporation so that the acceptor became lower in doping concentration from the anode in a linear fashion or, specifically, so that $TCNQF_4$ had a maximum doping concentration of 15% by weight on the anode and a doping concentration of 0% by weight in the position at a distance of 40 nm from the anode.

Similarly, a region in the positive and negative charge transporting light-emitting layer which extended from the cathode to a position at a distance of 40 nm from the cathode was doped with the donor by co-evaporation so that the donor became lower in doping concentration from the cathode in a linear fashion or, specifically, so that TTF had a maximum doping concentration of 10% by weight on the cathode and a doping concentration of 0% by weight in the position at a distance of 40 nm from the cathode. Furthermore, a region (20 nm) located in the center of the positive and negative charge transporting light-emitting layer was doped with $Ir(ppy)_3$ by co-evaporation so that $Ir(ppy)_3$ had a doping concentration of 6% by weight.

Next, the cathode, 100 nm in film thickness, was formed by depositing silver (Ag) on the positive and negative charge transporting light-emitting layer (at a deposition rate of 2 nm/sec).

Finally, the resulting substrate was joined to a glass substrate with a UV (ultraviolet) curing resin sandwiched therebetween, and the resin was cured for sealing by irradiating it with UV light of 6,000 mJ from a UV lamp. Thus obtained was an organic EL element composed of the anode, the positive and negative charge transporting light-emitting layer, and the cathode, i.e., constituted by a single-layer organic layer.

(Evaluation of the Electrical Characteristics of the Organic EL Element)

Next, the electrical characteristics of the organic EL element obtained in Example 1 were evaluated. It should be noted that the electrical characteristics were measured by using an OLED device optical characteristic inspecting apparatus (manufactured by Otsuka Electronics Co., Ltd.).

As a result of the measurement of the characteristics of the organic EL element of Example 1 with a voltage of 5 V applied thereto, it was found that the organic EL element has a luminous efficiency of 33 cd/A and a luminance of 14,000 $cd/m^2$. Further, as a result of the measurement of the life of the organic EL element from a point in time where the luminance had been adjusted to 1,000 $cd/m^2$ to a point in time where the luminance was reduced to half, it was found that the life was 20,000 hours.

Comparative Example 1

Multilayer Organic Electroluminescent Element

In Comparative Example 1, an organic EL element composed of six organic layers was fabricated in the following manner.

First, a transparent substrate on a surface of which a 50 mm×50 mm indium tin oxide (ITO) having a surface resistance of 10Ω/□ had been formed was used. The ITO, which would serve as an anode, was patterned into a stripe 2 mm in width. Next, the substrate was subjected to water washing, was further subjected to ten minutes of pure water ultrasonic washing, ten minutes of acetone ultrasonic washing, and five minutes of isopropyl alcohol steam washing, and was dried for one hour at 100° C. After that, the substrate was fixed to a substrate holder provided inside of a resistance heating evaporation apparatus, and the pressure was reduced to a vacuum of $1 \times 10^{-4}$ Pa or lower.

Next, with use of LGC101 (manufactured by LG Chem, LTD.) as a hole injection material, a hole injection layer 20 nm in film thickness was formed by resistance heating evaporation.

After that, with use of N,N'-di-1-naphthyl-N,N'-diphenyl-1,1' biphenyl-1,1'-biphenyl-4,4'-diamine (NPB) as a hole transport material, a hole injection layer 40 nm in film thickness was formed by resistance heating evaporation.

Further, with use of bis(carbazolin)benzodifuran (CZBDF) as a host material and tris(2-phenylpyridine) iridium (III) ($Ir(ppy)_3$) as an organic light-emitting material, a light-emitting layer 30 nm in film thickness was formed by resistance heating evaporation. In so doing, the host material was doped with 8% by weight of $Ir(ppy)_3$ by co-evaporation.

Next, with use of 2,9-dimethyl-4,7-diphenyl-1,10-phenanthroline (BCP) as a hole blocking material, a hole blocking layer 10 nm in film thickness was formed by resistance heating evaporation.

After that, with use of an aluminum quinolyl complex (Alq3) as an electron transport material, an electron transport layer 20 nm in film thickness was formed by resistance heating evaporation.

Further, with use of lithium fluoride (LiF) as an electron injection material, an electron injection layer 1 nm in film thickness was formed by resistance heating evaporation.

Furthermore, a cathode 100 nm in film thickness was formed by depositing silver (Ag) on the electron injection layer (at a deposition rate of 2 nm/sec).

Finally, the resulting substrate was joined to a glass substrate with a UV (ultraviolet) curing resin sandwiched therebetween, and the resin was cured for sealing by irradiating it with UV light of 6,000 mJ from a UV lamp. Thus obtained was an organic EL element composed of the anode, the hole injection layer, the hole transport layer, the light-emitting layer, the hole blocking layer, the electron transport layer, the electron injection layer, and the cathode, i.e., constituted by a multilayer organic layer.

As a result of the measurement of the characteristics of the organic EL element of Comparative Example 1 in the same manner as in Example 1, it was found that the organic EL element has a luminous efficiency of 32 cd/A and a luminance of 12,000 cd/m$^2$. Further, as a result of the measurement of the life of the organic EL element from a point in time where the luminance had been adjusted to 1,000 cd/m$^2$ to a point in time where the luminance was reduced to half, it was found that the life was 16,000 hours.

Comparative Example 2

Single-Layer Organic Electroluminescent Element

In Comparative Example 2, an organic EL element constituted by a single-layer organic layer was fabricated in the following manner as in Example 1. However, in Comparative Example 2, the positive and negative charge transporting light-emitting layer was doped with an acceptor and a donor without concentration gradients. That is, a region in the positive and negative charge transporting light-emitting layer which extended from the anode to a position at a distance of 40 nm from the anode was doped with TCNQF$_4$ so that TCNQF$_4$ had a constant doping concentration of 15% by weight, and a region in the positive and negative charge transporting light-emitting layer which extended from the cathode to a position at a distance of 40 nm from the cathode was doped with TTF so that TTF had a constant doping concentration of 10% by weight. Further, a region (20 nm) located in the center of the positive and negative charge transporting light-emitting layer was doped with Ir(ppy)$_3$ by so that Ir(ppy)$_3$ had a doping concentration of 6% by weight.

As a result of the measurement of the characteristics of the organic EL element of Comparative Example 2 in the same manner as in Example 1, it was found that the organic EL element has a luminous efficiency of 20 cd/A and a luminance of 8,000 cd/m$^2$. Further, as a result of the measurement of the life of the organic EL element from a point in time where the luminance had been adjusted to 1,000 cd/m$^2$ to a point in time where the luminance was reduced to half, it was found that the life was 6,000 hours.

It should be noted here that a comparison between the organic EL element of Comparative Example 1 and the organic EL element of Comparative Example 2 showed that Comparative Example 2 has a lower luminous efficiency of 20 cd/A than the luminous efficiency of 32 cd/A of Comparative Example 1 and Comparative Example 2 has a lower luminance 8,000 cd/m$^2$ than the luminance of 12,000 cd/m$^2$ of Comparative Example 1. Further, Comparative Example 2 has a much shorter luminance half-life of 6,000 hours than the luminance half-life of 16,000 hours of Comparative Example 1.

This result showed that since the region highly doped with the acceptor and the region doped with the organic light-emitting material are in contact with each other in Comparative Example 2, holes propagating through the acceptor cannot efficiently propagate to the positive and negative charge transporting material of the region doped with the organic light-emitting material. Further, since the region highly doped with the donor and the region doped with the organic light-emitting material are in contact with each other, electrons propagating through the donor cannot efficiently propagate to the positive and negative charge transporting material of the region doped with the organic light-emitting material.

Meanwhile, a comparison between the organic EL element of Example 1 and the organic EL elements of Comparative Examples 1 and 2 showed that Example 1 has a much higher luminous efficiency of 33 cd/A than the luminous efficiency of 20 cd/A of Comparative Example 2 and is equivalent in characteristic to 32 cd/A of the multilayer element of Comparative Example 1. Further, and Example 1 has a much higher luminance 14,000 cd/m$^2$ than the luminance of 8,000 cd/m$^2$ of Comparative Example 2 and is equivalent in characteristic to 12,000 cd/m$^2$ of Comparative Example 1. Furthermore, Example 1 has a much longer luminance half-life of 20,000 hours than the luminance half-life of 6,000 hours of Comparative Example 2 and is equivalent in characteristic to 16,000 hours of Comparative Example 1.

This result showed that since, in the organic EL element of Example 1, the concentration gradient in the acceptor causes the HOMO level of the region through which holes propagate to be lowest on a side of the region that is in contact with the anode and coincide substantially with the HOMO level of the positive and negative charge transporting material on a side of the region that faces the region doped with the organic light-emitting material, holes injected from the anode can be efficiently transported to the region doped with the organic light-emitting material.

Further, it was found that since the concentration gradient in the donor causes the LUMO level of the region through which electrons propagate to be highest on a side of the region that is in contact with the cathode and coincide substantially with the LUMO level of the positive and negative charge transporting material on a side of the region that faces the region doped with the organic light-emitting material, electrons injected from the cathode can be efficiently transported to the region doped with the organic light-emitting material.

Example 2

In Example 2, an organic EL element was fabricated in the same manner as in Example 1. However, while the positive and negative charge transporting light-emitting layer of Example 1 was doped with the acceptor and the donor with linear concentration gradients, the positive and negative charge transporting light-emitting layer of Example 2 was doped with the acceptor and the donor with exponential concentration gradients.

As a result of the measurement of the characteristics of the organic EL element of Example 2 in the same manner as in Example 1, it was found that the organic EL element has a luminous efficiency of 45 cd/A and a luminance of 22,000 cd/m$^2$. Further, as a result of the measurement of the life of the organic EL element from a point in time where the luminance had been adjusted to 1,000 cd/m$^2$ to a point in time where the luminance was reduced to half, it was found that the life was 24,000 hours.

It should be noted here that a comparison between the organic EL element of Example 1 and the organic EL element of Example 2 showed that Example 2 has a higher luminous efficiency of 45 cd/A than the luminous efficiency of 33 cd/A of Example 1 and Example 2 has a higher luminance 22,000 cd/m$^2$ than the luminance of 14,000 cd/m$^2$ of Example 1. Furthermore, Example 2 has a longer luminance half-life of 24,000 hours than the luminance half-life of 20,000 hours of Example 1.

This result showed that by charging the concentration gradient of the acceptor and the concentration gradient of the donor from linear to exponential, holes and electrons are allowed to more efficiently propagate to the positive and negative charge transporting material in the light-emitting region. Further, it was also found that a decrease in luminous efficiency due to energy transfer of excitation energy from the light-emitting material to the acceptor and to the donor can be more effectively prevented.

Example 3

In Example 3, with use of CZBDF as the positive and negative charge transporting material, $TCNQF_4$ as the acceptor, $Ir(ppy)_3$ as the organic light-emitting material, and TTF as the donor, a positive and negative charge transporting light-emitting layer 120 nm in film thickness was formed in the same manner as in Example 1.

However, in Example 3, a region in the positive and negative charge transporting light-emitting layer which extended from the anode to a position at a distance of 40 nm from the anode was doped with $TCNQF_4$ by co-evaporation so that $TCNQF_4$ became lower in doping concentration in an exponential fashion from the maximum 15% by weight on the anode to 0% by weight in the position at a distance of 40 nm from the anode.

Similarly, a region in the positive and negative charge transporting light-emitting layer which extended from the cathode to a position at a distance of 40 nm from the cathode was doped with TTF by co-evaporation so that TTF became lower in doping concentration in an exponential fashion from the maximum 10% by weight on the cathode to 0% by weight in the position at a distance of 40 nm from the cathode. Furthermore, a region (20 nm) located in the center of the positive and negative charge transporting light-emitting layer was doped with $Ir(ppy)_3$ by co-evaporation via a region constituted solely by the positive and negative charge transporting material and not doped with the acceptor, the donor, or the organic light-emitting material, so that $Ir(ppy)_3$ had a doping concentration of 6% by weight.

As a result of the measurement of the characteristics of the organic EL element of Example 3 in the same manner as in Example 1, it was found that the organic EL element has a luminous efficiency of 50 cd/A and a luminance of 25,000 $cd/m^2$. Further, as a result of the measurement of the life of the organic EL element from a point in time where the luminance had been adjusted to 1,000 $cd/m^2$ to a point in time where the luminance was reduced to half, it was found that the life was 30,000 hours.

It should be noted here that a comparison between the organic EL element of Example 2 and the organic EL element of Example 3 showed that Example 3 has a higher luminous efficiency of 50 cd/A than the luminous efficiency of 45 cd/A of Example 2 and Example 3 has a higher luminance 25,000 $cd/m^2$ than the luminance of 22,000 $cd/m^2$ of Example 2. Furthermore, Example 3 has a longer luminance half-life of 30,000 hours than the luminance half-life of 24,000 hours of Example 2.

This result showed that since the region doped with the positive and negative charge transporting material alone is provided between the region doped with the acceptor or with the donor and the region doped with the organic light-emitting material, holes and electrons are allowed to more efficiently propagate to the positive and negative charge transporting material in the light-emitting region, and that exciters formed in the light-emitting region are confined in the region formed by the positive and negative charge transporting material, so that deactivation of exciters in the acceptor region or in the donor region can be completely prevented.

Example 4

Fabrication of an Organic EL Display Device

In this example, an organic EL display device was fabricated in the following manner.

First, an amorphous silicon semiconductor film was formed by PECVD on a glass substrate. By subjecting the resulting substrate to crystallization, a polysilicon semiconductor film was formed.

Next, the polysilicon semiconductor film was patterned by photolithography into a plurality of islands. Then, on the polysilicon semiconductor film thus patterned, a gate insulating film and a gate electrode layer were formed in this order and patterned by photolithography.

After that, source and drain regions were formed by doping an impurity element such as phosphorous into the polysilicon semiconductor film thus patterned, and a planarizing film was formed after TFT elements had been fabricated.

The planarizing film was formed by first forming a silicon nitride film by PECVD and then laminating an acrylic resin layer by spin coating.

Specifically, by first forming the silicon nitride film and then etching the silicon nitride film and the gate insulating film altogether, contact holes that lead up to the source and/or drain regions were formed, and then source wires were formed. After that, the acrylic resin layer was formed, and contact holes that lead up to the drain regions were formed in the same positions as the drain region contact holes made in the gate insulating film and in the silicon nitride film. Thus, an active-matrix substrate was obtained.

It should be noted the planarizing film has its function realized by the acrylic resin layer. Further, a retention capacitor for retaining the gate potential of each TFT at a constant potential was formed by sandwiching an insulating film such as an interlayer insulating film between the drain of each switching TFT and the source of each driving TFT.

On the active-matrix substrate, contact holes were provided which passed through the planarizing layer and which electrically connected driving TFTs to the first electrodes (anodes or cathodes) of red, green, and blue organic EL elements.

Each of the first electrodes was formed by forming a 100 nm film of Ag (silver) and then forming a 20 nm film of ITO (indium oxide-tin oxide). At this point in time, each of the first electrodes had an area of 300 µm×300 µm.

Next, a 200 nm layer of $SiO_2$ was laminated on the first electrode by sputtering and patterned by conventional photolithography so as to cover an edge portion of the first electrode. An active-matrix substrate was obtained which had such a structure that the four sides of each first electrode were covered with $SiO_2$ by 10 µm from the edge.

The resulting active-matrix substrate was washed. Specifically, the resulting active-matrix substrate was subjected to ten minutes of ultrasonic washing with acetone and IPA and then thirty minutes of UV-ozone washing.

(Formation of a Blue Pixel)

Next, a blue light-emitting pixel was formed on a surface of a first electrode by an evaporation method using a shadow mask. With use of CZBDF as the positive and negative charge transporting material, $TCNQF_4$ as the acceptor, Cs (cesium) as the donor, and bis[(4,6-difluorophenyl)-pyridinato-N,C2] (picolinato) iridium (III) T1=2.8 eV (FIrpic) as an organic blue light-emitting material, a positive and negative charge transporting light-emitting layer 120 nm in film thickness was formed.

However, a region in the positive and negative charge transporting light-emitting layer which extended from the anode to a position at a distance of 40 nm from the anode was doped with $TCNQF_4$ by co-evaporation so that $TCNQF_4$ became lower in doping concentration in a linear fashion from the maximum 20% by weight on the anode to 0% by weight in the position at a distance of 40 nm from the anode. Similarly, a region in the positive and negative charge transporting light-emitting layer which extended from the cathode to a position at a distance of 40 nm from the cathode was doped with the Cs by co-evaporation so that Cs became lower in doping concentration in a linear fashion from the maximum 10% by weight on the cathode to 0% by weight in the position at a distance of 40 nm from the cathode. Furthermore, a region (20 nm) located in the center of the positive and negative charge transporting light-emitting layer was doped with FIrpic by co-evaporation via regions (10 nm each) constituted solely by the positive and negative charge transporting material and not doped with the acceptor, the donor, or the organic light-emitting material, so that FIrpic had a doping concentration of 6% by weight.

(Formation of a Green Pixel)

Next, a green light-emitting pixel was formed on a surface of a first electrode by an evaporation method using a shadow mask. With use of DPABDF as the positive and negative charge transporting material, $TCNQF_4$ as the acceptor, Cs (cesium) as the donor, and $Ir(ppy)_3$ as an organic green light-emitting material, a positive and negative charge transporting light-emitting layer 160 nm in film thickness was formed.

However, a region in the positive and negative charge transporting light-emitting layer which extended from the anode to a position at a distance of 80 nm from the anode was doped with $TCNQF_4$ by co-evaporation so that $TCNQF_4$ became lower in doping concentration in a linear fashion from the maximum 20% by weight on the anode to 0% by weight in the position at a distance of 80 nm from the anode. Similarly, a region in the positive and negative charge transporting light-emitting layer which extended from the cathode to a position at a distance of 40 nm from the cathode was doped with the Cs by co-evaporation so that Cs became lower in doping concentration in a linear fashion from the maximum 10% by weight on the cathode to 0% by weight in the position at a distance of 40 nm from the cathode. Furthermore, a region (20 nm) located in the center of the positive and negative charge transporting light-emitting layer was doped with $Ir(ppy)_3$ by co-evaporation via regions (20 nm each) constituted solely by the positive and negative charge transporting material and not doped with the acceptor, the donor, or the organic light-emitting material, so that $Ir(ppy)_3$ had a doping concentration of 6% by weight.

(Formation of a Red Pixel)

Next, a red light-emitting pixel was formed on a surface of a first electrode by an evaporation method using a shadow mask. With use of DPABDF as the positive and negative charge transporting material, $TCNQF_4$ as the acceptor, Cs (cesium) as the donor, and tris(1-phenylisoquinoline) iridium (III) T1=2.0 eV ($Ir(piq)_3$) as an organic red light-emitting material, a positive and negative charge transporting light-emitting layer 200 nm in film thickness was formed.

However, a region in the positive and negative charge transporting light-emitting layer which extended from the anode to a position at a distance of 140 nm from the anode was doped with $TCNQF_4$ by co-evaporation so that $TCNQF_4$ became lower in doping concentration in a linear fashion from the maximum 20% by weight on the anode to 0% by weight in the position at a distance of 140 nm from the anode. Similarly, a region in the positive and negative charge transporting light-emitting layer which extended from the cathode to a position at a distance of 40 nm from the cathode was doped with the Cs by co-evaporation so that Cs became lower in doping concentration in a linear fashion from the maximum 10% by weight on the cathode to 0% by weight in the position at a distance of 40 nm from the cathode. Furthermore, a region (20 nm) located in the center of the positive and negative charge transporting light-emitting layer was doped with $Ir(piq)_3$ by co-evaporation via regions (20 nm each) constituted solely by the positive and negative charge transporting material and not doped with the acceptor, the donor, or the organic light-emitting material, so that $Ir(piq)_3$ had a doping concentration of 6% by weight.

After these three colors of pixels had been formed, second electrodes (to be paired with the first electrodes, respectively) were formed.

First, the substrate on which the pixels had been formed was fixed to a metal evaporation chamber. Next, the substrate was aligned with a second-electrode-forming shadow mask, and a desired pattern of silver (10 nm in thickness) was formed by vacuum evaporation on surfaces of the organic EL layers, whereby translucent second electrodes were formed.

Furthermore, on the translucent second electrodes, an inorganic protecting layer composed $SiO_2$ 2 μm in thickness was pattern-formed by plasma CVD with use of a shadow mask so as not to be formed in an area where wires from the display are taken out (FPC connection area)

Next, the substrate and a sealing glass over which a UV curing resin adhesive had been applied by a dispenser were joined on top of each other in a dry air environment (with a moisture content of −80° C.), and the UV curing resin adhesive was cured by irradiating it with curing UV light.

At this point in time, an organic EL panel was obtained by joining a polarizer on a side of the substrate through which light produced in the organic EL layers is taken out to the outside.

After that, by mounting an external drive circuit and the like on the organic EL panel, an EL organic display device was obtained.

The organic EL display device thus fabricated was confirmed to emit uniform light at a high luminance (300 cd/m$^2$) without unevenness.

Example 5

In Example 5, an organic EL element was fabricated in the same manner as in Example 1. However, while the positive and negative charge transporting light-emitting layer of Example 1 was doped with the acceptor and the donor with linear concentration gradients, the positive and negative charge transporting light-emitting layer of Example 5 was doped with the acceptor and the donor so that the acceptor and the donor decreased in concentration from the electrodes in proportion to the squares of the distances from the electrodes, respectively.

As a result of the measurement of the characteristics of the organic EL element of Example 5 in the same manner as in Example 1, it was found that the organic EL element has a luminous efficiency of 40 cd/A and a luminance of 21,000 cd/m$^2$. Further, as a result of the measurement of the life of the organic EL element from a point in time where the luminance had been adjusted to 1,000 cd/m$^2$ to a point in time where the luminance was reduced to half, it was found that the life was 22,000 hours.

It should be noted here that a comparison between the organic EL element of Example 1 and the organic EL element of Example 5 showed that Example 5 has a higher luminous efficiency of 40 cd/A than the luminous efficiency of 33 cd/A of Example 1 and Example 5 has a higher luminance 21,000 cd/m$^2$ than the luminance of 14,000 cd/m$^2$ of Example 1. Furthermore, Example 5 has a longer luminance half-life of 22,000 hours than the luminance half-life of 20,000 hours of Example 1.

This result showed that by charging the concentration gradient of the acceptor and the concentration gradient of the donor from linear gradients to such gradients that the acceptor and the donor decrease in concentration from the electrodes in proportion to the squares of the distances from the electrodes, respectively, holes and electrons are allowed to more efficiently propagate to the positive and negative charge transporting material in the light-emitting region.

Further, it was also found that a decrease in luminous efficiency due to energy transfer of excitation energy from the light-emitting material to the acceptor and to the donor can be more effectively prevented.

Example 6

In Example 6, an organic EL element was fabricated in the same manner as in Example 1. However, while the positive and negative charge transporting light-emitting layer of Example 1 was doped with the acceptor and the donor with linear concentration gradients, the positive and negative charge transporting light-emitting layer of Example 6 was doped with the acceptor and the donor so that the acceptor and the donor decreased in concentration from the electrodes in proportion to the cubes of the distances from the electrodes, respectively.

As a result of the measurement of the characteristics of the organic EL element of Example 6 in the same manner as in Example 1, it was found that the organic EL element has a luminous efficiency of 41 cd/A and a luminance of 22,000 cd/m$^2$. Further, as a result of the measurement of the life of the organic EL element from a point in time where the luminance had been adjusted to 1,000 cd/m$^2$ to a point in time where the luminance was reduced to half, it was found that the life was 22,000 hours.

It should be noted here that a comparison between the organic EL element of Example 1 and the organic EL element of Example 6 showed that Example 6 has a higher luminous efficiency of 41 cd/A than the luminous efficiency of 33 cd/A of Example 1 and Example 6 has a higher luminance 22,000 cd/m$^2$ than the luminance of 14,000 cd/m$^2$ of Example 1. Furthermore, Example 6 has a longer luminance half-life of 22,000 hours than the luminance half-life of 20,000 hours of Example 1.

This result showed that by charging the concentration gradient of the acceptor and the concentration gradient of the donor from linear gradients to such gradients that the acceptor and the donor decrease in concentration from the electrodes in proportion to the cubes of the distances from the electrodes, respectively, holes and electrons are allowed to more efficiently propagate to the positive and negative charge transporting material in the light-emitting region. Further, it was also found that a decrease in luminous efficiency due to energy transfer of excitation energy from the light-emitting material to the acceptor and to the donor can be more effectively prevented.

Example 7

In Example 7, an organic EL element was fabricated in the same manner as in Example 1. However, while the positive and negative charge transporting light-emitting layer of Example 1 was doped with the acceptor and the donor with linear concentration gradients, the positive and negative charge transporting light-emitting layer of Example 7 was doped with the acceptor and the donor so that the acceptor and the donor decreased in concentration from the electrodes in proportion to the fourth powers of the distances from the electrodes, respectively.

As a result of the measurement of the characteristics of the organic EL element of Example 7 in the same manner as in Example 1, it was found that the organic EL element has a luminous efficiency of 42 cd/A and a luminance of 22,000 cd/m$^2$. Further, as a result of the measurement of the life of the organic EL element from a point in time where the luminance had been adjusted to 1,000 cd/m$^2$ to a point in time where the luminance was reduced to half, it was found that the life was 22,000 hours.

It should be noted here that a comparison between the organic EL element of Example 1 and the organic EL element of Example 7 showed that Example 7 has a higher luminous efficiency of 42 cd/A than the luminous efficiency of 33 cd/A of Example 1 and Example 7 has a higher luminance 22,000 cd/m$^2$ than the luminance of 14,000 cd/m$^2$ of Example 1. Furthermore, Example 7 has a longer luminance half-life of 22,000 hours than the luminance half-life of 20,000 hours of Example 1.

This result showed that by charging the concentration gradient of the acceptor and the concentration gradient of the donor from linear gradients to such gradients that the acceptor and the donor decrease in concentration from the electrodes in proportion to the fourth powers of the distances from the electrodes, respectively, holes and electrons are allowed to more efficiently propagate to the positive and negative charge transporting material in the light-emitting region. Further, it was also found that a decrease in luminous efficiency due to energy transfer of excitation energy from the light-emitting material to the acceptor and to the donor can be more effectively prevented.

Example 8

In Example 8, an organic EL element was fabricated in the same manner as in Example 1. However, while the positive and negative charge transporting light-emitting layer of Example 1 was doped with the acceptor and the donor with linear concentration gradients, the positive and negative charge transporting light-emitting layer of Example 8 was doped with the acceptor and the donor so that the acceptor and the donor decreased in concentration from the electrodes in proportion to the fifth powers of the distances from the electrodes, respectively.

As a result of the measurement of the characteristics of the organic EL element of Example 8 in the same manner as in Example 1, it was found that the organic EL element has a luminous efficiency of 43 cd/A and a luminance of 22,000 cd/m$^2$. Further, as a result of the measurement of the life of the organic EL element from a point in time where the luminance had been adjusted to 1,000 cd/m$^2$ to a point in time where the luminance was reduced to half, it was found that the life was 22,000 hours.

It should be noted here that a comparison between the organic EL element of Example 1 and the organic EL element of Example 8 showed that Example 8 has a higher luminous efficiency of 43 cd/A than the luminous efficiency of 33 cd/A of Example 1 and Example 8 has a higher luminance 22,000 cd/m$^2$ than the luminance of 14,000 cd/m$^2$ of Example 1.

Furthermore, Example 8 has a longer luminance half-life of 22,000 hours than the luminance half-life of 20,000 hours of Example 1.

This result showed that by charging the concentration gradient of the acceptor and the concentration gradient of the donor from linear gradients to such gradients that the acceptor and the donor decrease in concentration from the electrodes in proportion to the fifth powers of the distances from the electrodes, respectively, holes and electrons are allowed to more efficiently propagate to the positive and negative charge transporting material in the light-emitting region. Further, it was also found that a decrease in luminous efficiency due to energy transfer of excitation energy from the light-emitting material to the acceptor and to the donor can be more effectively prevented.

Example 9

In Example 9, an organic EL element was fabricated in the same manner as in Example 2. However, in Example 9, a region (20 nm) located in the center of the positive and negative charge transporting light-emitting layer was doped with $Ir(ppy)_3$ by co-evaporation so that $Ir(ppy)_3$ had a doping concentration of 6% by weight with such a concentration gradient that $Ir(ppy)_3$ had a maximum doping amount of 6% by weight in a central portion (position at a distance of 50 nm from the anode) of the positive and negative charge transporting light-emitting layer and decreased in doping concentration exponentially toward the anode and toward the cathode, respectively.

As a result of the measurement of the characteristics of the organic EL element of Example 9 in the same manner as in Example 1, it was found that the organic EL element has a luminous efficiency of 50 cd/A and a luminance of 24,000 cd/m². Further, as a result of the measurement of the life of the organic EL element from a point in time where the luminance had been adjusted to 1,000 cd/m² to a point in time where the luminance was reduced to half, it was found that the life was 35,000 hours.

It should be noted here that a comparison between the organic EL element of Example 2 and the organic EL element of Example 9 showed that Example 9 has a higher luminous efficiency of 50 cd/A than the luminous efficiency of 45 cd/A of Example 2 and Example 9 has a higher luminance 24,000 cd/m² than the luminance of 22,000 cd/m² of Example 2. Furthermore, Example 9 has a longer luminance half-life of 35,000 hours than the luminance half-life of 24,000 hours of Example 2.

This result showed that by charging the concentration gradient of the light-emitting material to an exponential gradient, holes and electrons are allowed to more efficiently propagate to the positive and negative charge transporting material in the light-emitting region. Further, it was also found that a decrease in luminous efficiency due to energy transfer of excitation energy from the light-emitting material to the acceptor and to the donor can be more effectively prevented.

Example 10

In Example 10, an organic EL element was fabricated in the same manner as in Example 2. However, in Example 10, a region (20 nm) located in the center of the positive and negative charge transporting light-emitting layer was doped with $Ir(ppy)_3$ by co-evaporation so that $Ir(ppy)_3$ had a doping concentration of 6% by weight with such a concentration gradient that $Ir(ppy)_3$ had a maximum doping amount of 6% by weight in a central portion (position at a distance of 50 nm from the anode) of the positive and negative charge transporting light-emitting layer and decreased in doping concentration in proportion to the square of the distance toward the anode and toward the cathode, respectively.

As a result of the measurement of the characteristics of the organic EL element of Example 10 in the same manner as in Example 1, it was found that the organic EL element has a luminous efficiency of 52 cd/A and a luminance of 24,000 cd/m². Further, as a result of the measurement of the life of the organic EL element from a point in time where the luminance had been adjusted to 1,000 cd/m² to a point in time where the luminance was reduced to half, it was found that the life was 37,000 hours.

It should be noted here that a comparison between the organic EL element of Example 2 and the organic EL element of Example 10 showed that Example 10 has a higher luminous efficiency of 52 cd/A than the luminous efficiency of 45 cd/A of Example 2 and Example 10 has a higher luminance 24,000 cd/m² than the luminance of 22,000 cd/m² of Example 2. Furthermore, Example 10 has a longer luminance half-life of 37,000 hours than the luminance half-life of 24,000 hours of Example 2.

This result showed that by charging the concentration gradient of the light-emitting material to such a gradient that the light-emitting material decreases in doping concentration in proportion to the square of the distance toward the anode and toward the cathode, respectively, holes and electrons are allowed to more efficiently propagate to the positive and negative charge transporting material in the light-emitting region. Further, it was also found that a decrease in luminous efficiency due to energy transfer of excitation energy from the light-emitting material to the acceptor and to the donor can be more effectively prevented.

Example 11

In Example 11, an organic EL element was fabricated in the same manner as in Example 2. However, in Example 11, a region (20 nm) located in the center of the positive and negative charge transporting light-emitting layer was doped with $Ir(ppy)_3$ by co-evaporation so that $Ir(ppy)_3$ had a doping concentration of 6% by weight with such a concentration gradient that $Ir(ppy)_3$ had a maximum doping amount of 6% by weight in a central portion (position at a distance of 50 nm from the anode) of the positive and negative charge transporting light-emitting layer and decreased in doping concentration in proportion to the cube of the distance toward the anode and toward the cathode, respectively.

As a result of the measurement of the characteristics of the organic EL element of Example 11 in the same manner as in Example 1, it was found that the organic EL element has a luminous efficiency of 53 cd/A and a luminance of 24,000 cd/m². Further, as a result of the measurement of the life of the organic EL element from a point in time where the luminance had been adjusted to 1,000 cd/m² to a point in time where the luminance was reduced to half, it was found that the life was 38,000 hours.

It should be noted here that a comparison between the organic EL element of Example 2 and the organic EL element of Example 11 showed that Example 11 has a higher luminous efficiency of 53 cd/A than the luminous efficiency of 45 cd/A of Example 2 and Example 11 has a higher luminance 24,000 cd/m² than the luminance of 22,000 cd/m² of Example 2. Furthermore, Example 11 has a longer luminance half-life of 38,000 hours than the luminance half-life of 24,000 hours of Example 2.

This result showed that by charging the concentration gradient of the light-emitting material to such a gradient that the light-emitting material decreases in doping concentration in proportion to the cube of the distance toward the anode and toward the cathode, respectively, holes and electrons are allowed to more efficiently propagate to the positive and negative charge transporting material in the light-emitting region. Further, it was also found that a decrease in luminous efficiency due to energy transfer of excitation energy from the light-emitting material to the acceptor and to the donor can be more effectively prevented.

Example 12

In Example 12, an organic EL element was fabricated in the same manner as in Example 2. However, in Example 12, a region (20 nm) located in the center of the positive and negative charge transporting light-emitting layer was doped with $Ir(ppy)_3$ by co-evaporation so that $Ir(ppy)_3$ had a doping concentration of 6% by weight with such a concentration gradient that $Ir(ppy)_3$ had a maximum doping amount of 6% by weight in a central portion (position at a distance of 50 nm from the anode) of the positive and negative charge transporting light-emitting layer and decreased in doping concentration in proportion to the fourth power of the distance toward the anode and toward the cathode, respectively.

As a result of the measurement of the characteristics of the organic EL element of Example 12 in the same manner as in Example 1, it was found that the organic EL element has a luminous efficiency of 53 cd/A and a luminance of 24,000 cd/m$^2$. Further, as a result of the measurement of the life of the organic EL element from a point in time where the luminance had been adjusted to 1,000 cd/m$^2$ to a point in time where the luminance was reduced to half, it was found that the life was 33,000 hours.

It should be noted here that a comparison between the organic EL element of Example 2 and the organic EL element of Example 12 showed that Example 12 has a higher luminous efficiency of 53 cd/A than the luminous efficiency of 45 cd/A of Example 2 and Example 12 has a higher luminance 24,000 cd/m$^2$ than the luminance of 22,000 cd/m$^2$ of Example 2. Furthermore, Example 12 has a longer luminance half-life of 33,000 hours than the luminance half-life of 24,000 hours of Example 2.

This result showed that by charging the concentration gradient of the light-emitting material to such a gradient that the light-emitting material decreases in doping concentration in proportion to the fourth power of the distance toward the anode and toward the cathode, respectively holes and electrons are allowed to more efficiently propagate to the positive and negative charge transporting material in the light-emitting region. Further, it was also found that a decrease in luminous efficiency due to energy transfer of excitation energy from the light-emitting material to the acceptor and to the donor can be more effectively prevented.

Example 13

In Example 13, an organic EL element was fabricated in the same manner as in Example 2. However, in Example 13, a region (20 nm) located in the center of the positive and negative charge transporting light-emitting layer was doped with $Ir(ppy)_3$ by co-evaporation so that $Ir(ppy)_3$ had a doping concentration of 6% by weight with such a concentration gradient that $Ir(ppy)_3$ had a maximum doping amount of 6% by weight in a central portion (position at a distance of 50 nm from the anode) of the positive and negative charge transporting light-emitting layer and decreased in doping concentration in proportion to the fifth power of the distance toward the anode and toward the cathode, respectively.

As a result of the measurement of the characteristics of the organic EL element of Example 13 in the same manner as in Example 1, it was found that the organic EL element has a luminous efficiency of 54 cd/A and a luminance of 24,000 cd/m$^2$. Further, as a result of the measurement of the life of the organic EL element from a point in time where the luminance had been adjusted to 1,000 cd/m$^2$ to a point in time where the luminance was reduced to half, it was found that the life was 38,000 hours.

It should be noted here that a comparison between the organic EL element of Example 2 and the organic EL element of Example 13 showed that Example 13 has a higher luminous efficiency of 54 cd/A than the luminous efficiency of 45 cd/A of Example 2 and Example 13 has a higher luminance 24,000 cd/m$^2$ than the luminance of 22,000 cd/m$^2$ of Example 2. Furthermore, Example 13 has a longer luminance half-life of 38,000 hours than the luminance half-life of 24,000 hours of Example 2.

This result showed that by charging the concentration gradient of the light-emitting material to such a gradient that the light-emitting material decreases in doping concentration in proportion to the fifth power of the distance toward the anode and toward the cathode, respectively, holes and electrons are allowed to more efficiently propagate to the positive and negative charge transporting material in the light-emitting region. Further, it was also found that a decrease in luminous efficiency due to energy transfer of excitation energy from the light-emitting material to the acceptor and to the donor can be more effectively prevented.

The present invention is not limited to the description of the embodiments above, but may be altered by a skilled person within the scope of the claims. An embodiment based on a proper combination of technical means disclosed in different embodiments is encompassed in the technical scope of the present invention.

The organic electroluminescent element according to the present invention is preferably configured such that the organic light-emitting material has such a concentration gradient in the third region as to become higher in concentration from sides facing the first and second regions toward a center of the third region.

According to the foregoing configuration, in an interfacial region of the third region with the first region, the organic light-emitting material is low in concentration. This allows holes having been propagating through the acceptor to efficiently propagate to the positive and negative charge transporting material in the interfacial region and, ultimately, allows the holes to completely propagate through the positive and negative charge transporting material in the third region.

Similarly, in an interfacial region of the third region with the second region, the organic light-emitting material is low in concentration. This allows electrons having been propagating through the donor to efficiently propagate to the positive and negative charge transporting material in the interfacial region and, ultimately, allows the electrons to completely propagate through the positive and negative charge transporting material in the third region.

Further, the organic electroluminescent element according to the present invention is preferably configured to further include a positive and negative charge transporting material region containing neither the acceptor nor the organic light-emitting material, the positive and negative charge transporting material region being sandwiched between the first region and the third region.

According to the foregoing configuration, before being injected into the third region doped with the organic light-emitting material, holes transported from the first region pass through the positive and negative transporting material region containing neither the acceptor nor the organic light-emitting material.

This prevents direct contact between the organic light-emitting material and the acceptor, thereby preventing exciters generated in the organic light-emitting material from being deactivated by making an energy transfer to the acceptor. This makes it possible to effectively achieve high luminous efficiency.

Further, the organic electroluminescent element according to the present invention is preferably configured to further include a positive and negative charge transporting material region containing neither the donor nor the organic light-emitting material, the positive and negative charge transporting material region being sandwiched between the second region and the third region.

Further, before being injected into the third region doped with the organic light-emitting material, electrons transported from the second region pass through the positive and negative transporting material region containing neither the donor nor the organic light-emitting material.

This prevents direct contact between the organic light-emitting material and the donor, thereby preventing exciters generated in the organic light-emitting material from being deactivated by making an energy transfer to the donor. This makes it possible to effectively achieve high luminous efficiency.

Further, the organic electroluminescent element according to the present invention is preferably configured such that the positive and negative charge transporting material region has a film thickness of 5 to 30 nm. This facilitates the injection and transport of holes and electrons, so that high characteristics (maximum luminance, high efficiency, long life, low drive voltage, etc.) can be obtained.

Further, the organic electroluminescent element according to the present invention is preferably configured such that the concentration gradient of the acceptor in the first region and the concentration gradient of the donor in the second region are exponential.

This allows the holes and the electrons to more efficiently propagate through the positive and negative charge transporting material in the third region, thus bringing about an improvement in luminous efficiency.

Further, the organic electroluminescent element according to the present invention is preferably configured such that: the concentration gradient of the acceptor in the first region is such that the acceptor becomes lower in concentration from the anode toward the third region in proportion to an nth power ($n \geq 1$) of a distance from the anode; and the concentration gradient of the donor in the second region is such that the donor becomes lower in concentration from the cathode toward the third region in proportion to an nth power ($n \geq 1$) of a distance from the cathode.

Further, the method for manufacturing an organic electroluminescent element according to the present invention is preferably configured such that when the supply means are horizontally arranged and the acceptor, the organic light-emitting material, the donor, and the positive and negative charge transporting material are supplied in a downward vertical direction from the respective supply means, the substrate is moved such that a side of the substrate onto which the acceptor, the organic light-emitting material, the donor, and the positive and negative charge transporting material from the respective supply means are to be deposited faces the evaporation sources. Further, the method for manufacturing an organic electroluminescent element according to the present invention is preferably configured such that when the supply means are horizontally arranged and the acceptor, the organic light-emitting material, the donor, and the positive and negative charge transporting material are supplied in a horizontal direction from the evaporation sources, the substrate is moved such that a side of the substrate onto which the acceptor, the organic light-emitting material, the donor, and the positive and negative charge transporting material from the evaporation sources are to be deposited faces the evaporation sources.

According to the foregoing configuration, the acceptor, the organic light-emitting material, the donor, and the positive and negative charge transporting material are supplied in a downward vertical direction or a horizontal direction from the respective supply means horizontally arranged. Moving a substrate along a side onto which the materials are supplied from such supply means makes it unnecessary to suspend a shadow mask for use in coating of separate colors in a production line, for example, in a case where full-color organic EL elements are manufactured. This makes it possible to reduce bending of the mask due to suspension. This makes it possible to carry out patterning with use of the mask in a case where EL elements are fabricated on a large-sized substrate. This results in an improvement in productivity and a reduction in cost.

INDUSTRIAL APPLICABILITY

The present invention can be applied to various types of device using organic EL elements, e.g., to display devices such as televisions or to illuminating devices, etc.

REFERENCE SIGNS LIST 1, 10 Organic EL element
2, 11 Substrate
3, 12 Anode
4, 18 Cathode
5, 19 Organic EL layer (organic layer)

The invention claimed is:
1. An organic electroluminescent element comprising:
an anode;
a cathode;
an organic layer, sandwiched between the anode and the cathode, which contains a positive and negative charge transporting material,
the organic layer including a first region doped with an acceptor, a second region doped with a donor, and a third region doped with an organic light-emitting material, the first region being located the closest to the anode in the organic layer, the second region being located the closest to the cathode in the organic layer, the third region being located between the first region and the second region,
the acceptor having such a concentration gradient in the first region as to become lower in concentration from an end of the organic layer on an anode side toward the third region,
the donor having such a concentration gradient in the second region as to become lower in concentration from an end of the organic layer on a cathode side toward the third region; and
the concentration gradient of the acceptor in the first region is such that the acceptor becomes lower in concentration from the anode toward the third region in proportion to an nth power ($n > 1$) of a distance from the anode; and the concentration gradient of the donor in the second region is such that the donor becomes lower in concentration from the cathode toward the third region in proportion to an nth power (n>1) of a distance from the cathode.

2. The organic electroluminescent element as set forth in claim 1, wherein the organic light-emitting material has such a concentration gradient in the third region as to become higher in concentration from sides facing the first and second regions toward a center of the third region.

3. The organic electroluminescent element as set forth in claim 1, further comprising a positive and negative charge transporting material region containing neither the acceptor nor the organic light-emitting material, the positive and negative charge transporting material region being sandwiched between the first region and the third region.

4. The organic electroluminescent element as set forth in claim 1, further comprising a positive and negative charge transporting material region containing neither the donor nor the organic light-emitting material, the positive and negative charge transporting material region being sandwiched between the second region and the third region.

5. The organic electroluminescent element as set forth in claim 3, wherein the positive and negative charge transporting material region has a film thickness of 5 to 30 nm.

6. An organic electroluminescent display device comprising display means including a thin-transistor substrate and the organic electroluminescent element as set forth in claim 1, the organic electroluminescent element being provided on the thin-transistor substrate.

7. An organic electroluminescent illuminating device comprising the organic electroluminescent element as set forth in claim 1.

8. A method for manufacturing the organic electroluminescent element as set forth in claim 1, the method comprising the step of, while moving a substrate along a parallel arrangement of evaporation sources filled with an acceptor, an organic light-emitting material, a donor, and a positive and negative charge transporting material, respectively, depositing the acceptor, the organic light-emitting material, the donor, and the positive and negative charge transporting material from the evaporation sources onto the substrate.

9. The method as set forth in claim 8, wherein when the evaporation sources are horizontally arranged and the acceptor, the organic light-emitting material, the donor, and the positive and negative charge transporting material evaporate in a downward vertical direction from the respective evaporation sources, the substrate is moved such that a side of the substrate onto which the acceptor, the organic light-emitting material, the donor, and the positive and negative charge transporting material from the respective evaporation sources are to be deposited faces the evaporation sources.

10. The method as set forth in claim 8, wherein when the evaporation sources are vertically arranged and the acceptor, the organic light-emitting material, the donor, and the positive and negative charge transporting material evaporate in a horizontal direction from the evaporation sources, the substrate is moved such that a side of the substrate onto which the acceptor, the organic light-emitting material, the donor, and the positive and negative charge transporting material from the evaporation sources are to be deposited faces the evaporation sources.

11. An organic electroluminescent element comprising:
an anode;
a cathode; and
an organic layer, sandwiched between the anode and the cathode, which contains a positive and negative charge transporting material,
the organic layer including a first region doped with an acceptor, a second region doped with a donor, and a third region doped with an organic light-emitting material, the first region being located the closest to the anode in the organic layer, the second region being located the closest to the cathode in the organic layer, the third region being located between the first region and the second region,
the acceptor having such a concentration gradient in the first region as to become lower in concentration from an end of the organic layer on an anode side toward the third region,
the donor having such a concentration gradient in the second region as to become lower in concentration from an end of the organic layer on a cathode side toward the third region,
wherein the organic light-emitting material has such a concentration gradient in the third region as to become higher in concentration from sides facing the first and second regions toward a center of the third region.

12. An organic electroluminescent element comprising:
an anode;
a cathode;
an organic layer, sandwiched between the anode and the cathode, which contains a positive and negative charge transporting material,
the organic layer including a first region doped with an acceptor, a second region doped with a donor, and a third region doped with an organic light-emitting material, the first region being located the closest to the anode in the organic layer, the second region being located the closest to the cathode in the organic layer, the third region being located between the first region and the second region,
the acceptor having such a concentration gradient in the first region as to become lower in concentration from an end of the organic layer on an anode side toward the third region,
the donor having such a concentration gradient in the second region as to become lower in concentration from an end of the organic layer on a cathode side toward the third region; and
a positive and negative charge transporting material region containing neither the acceptor nor the organic light-emitting material, the positive and negative charge transporting material region being sandwiched between the first region and the third region.

* * * * *